(12) United States Patent
Steckel et al.

(10) Patent No.: US 10,700,236 B2
(45) Date of Patent: Jun. 30, 2020

(54) QUANTUM DOT SPACING FOR HIGH EFFICIENCY QUANTUM DOT LED DISPLAYS

(71) Applicant: Apple Inc., Cupertino, CA (US)

(72) Inventors: Jonathan S. Steckel, Cupertino, CA (US); Hitoshi Yamamoto, Morgan Hill, CA (US); Paul S. Drzaic, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/694,378

(22) Filed: Sep. 1, 2017

(65) Prior Publication Data
US 2018/0019371 A1    Jan. 18, 2018

Related U.S. Application Data

(63) Continuation-in-part of application No. 15/192,938, filed on Jun. 24, 2016, now Pat. No. 9,768,404.
(Continued)

(51) Int. Cl.
*H01L 33/00* (2010.01)
*H01L 27/00* (2006.01)
(Continued)

(52) U.S. Cl.
CPC .......... *H01L 33/06* (2013.01); *C09K 11/025* (2013.01); *C09K 11/0883* (2013.01);
(Continued)

(58) Field of Classification Search
CPC ... H01L 27/156; H01L 27/32; H01L 27/1225; H01L 27/3244; H01L 33/30; H01L 33/28;
(Continued)

(56) References Cited

U.S. PATENT DOCUMENTS 7,615,800 B2 *  11/2009  Kahen ............... B82Y 10/00
                                                    257/103
7,767,260 B2 *   8/2010  Peng ................ B82Y 15/00
                                                    427/214

(Continued)

FOREIGN PATENT DOCUMENTS

WO       2015056750 A1    4/2015
WO    WO 2015/101777 A1   7/2015

OTHER PUBLICATIONS

Pfohl et al., "Ellipsometric Study of the Wetting of Air/Water Interfaces with Hexane, Heptane, and Octane from Saturated Alkane Vapors", 1998, Langmuir, vol. 14, pp. 5285-5291, published on Aug. 15, 1998 (Year: 1998).*

(Continued)

*Primary Examiner* — Nikolay K Yushin
(74) *Attorney, Agent, or Firm* — Jaffery Watson Mendonsa & Hamilton LLP

(57) ABSTRACT

Quantum dot layers and display devices including quantum dot layers are described. In an embodiment the quantum dot layer includes quantum dots with coatings to adjust the spacing between adjacent quantum dots. In an embodiment, the coatings are metal oxide coatings and may create a charge transporting matrix. In an embodiment, the coatings are core-material coatings. The QD layers may be QD-LED compatible.

16 Claims, 14 Drawing Sheets

Related U.S. Application Data

(60) Provisional application No. 62/351,739, filed on Jun. 17, 2016, provisional application No. 62/309,768, filed on Mar. 17, 2016.

(51) Int. Cl.

| | |
|---|---|
| *H01L 33/06* | (2010.01) |
| *H01L 33/30* | (2010.01) |
| *H01L 33/28* | (2010.01) |
| *H01L 33/50* | (2010.01) |
| *H01L 27/15* | (2006.01) |
| *C09K 11/08* | (2006.01) |
| *C09K 11/75* | (2006.01) |
| *C09K 11/56* | (2006.01) |
| *H01L 27/12* | (2006.01) |
| *C09K 11/02* | (2006.01) |
| *C09K 11/70* | (2006.01) |
| *H01L 51/50* | (2006.01) |
| *C09K 11/74* | (2006.01) |
| *C09K 11/89* | (2006.01) |
| *C09K 11/88* | (2006.01) |
| *B82Y 20/00* | (2011.01) |
| *H01L 51/52* | (2006.01) |
| *B82Y 30/00* | (2011.01) |
| *H01L 27/32* | (2006.01) |

(52) U.S. Cl.
CPC ............ *C09K 11/565* (2013.01); *C09K 11/70* (2013.01); *C09K 11/7442* (2013.01); *C09K 11/75* (2013.01); *C09K 11/883* (2013.01); *C09K 11/892* (2013.01); *H01L 27/1225* (2013.01); *H01L 27/156* (2013.01); *H01L 33/28* (2013.01); *H01L 33/30* (2013.01); *H01L 33/502* (2013.01); *H01L 33/505* (2013.01); *H01L 51/502* (2013.01); *B82Y 20/00* (2013.01); *B82Y 30/00* (2013.01); *H01L 27/322* (2013.01); *H01L 51/5036* (2013.01); *H01L 51/5044* (2013.01); *H01L 51/5056* (2013.01); *H01L 51/5072* (2013.01); *H01L 51/5278* (2013.01); *H01L 2251/552* (2013.01); *H01L 2251/558* (2013.01)

(58) Field of Classification Search
CPC ..... H01L 33/06; H01L 33/505; H01L 33/502; H01L 27/322; H01L 51/502; H01L 51/5044; H01L 51/5056; H01L 51/5072; H01L 51/5278; H01L 2251/552; H01L 2251/558; C09K 11/75; C09K 11/883; C09K 11/892; C09K 11/025; C09K 11/0883; C09K 11/565; C09K 11/70; C09K 11/7442; B82Y 20/00; B82Y 30/00
See application file for complete search history.

(56) References Cited

U.S. PATENT DOCUMENTS

| | | | |
|---|---|---|---|
| 8,309,947 B2 | 11/2012 | Vaufrey | |
| 8,742,399 B2* | 6/2014 | Murayama | H01L 31/035218 257/13 |
| 8,759,826 B2 | 6/2014 | Oikawa | |
| 8,846,418 B2 | 9/2014 | Kim et al. | |
| 8,889,457 B2* | 11/2014 | Kurtin | H01L 33/005 438/63 |
| 8,993,995 B2* | 3/2015 | Miyata | B82Y 20/00 257/13 |
| 9,054,329 B2* | 6/2015 | Coe-Sullivan | B82Y 20/00 |
| 9,054,330 B2* | 6/2015 | Qian | H01L 51/502 |
| 9,159,872 B2 | 10/2015 | Kurtin et al. | |
| 9,412,905 B2* | 8/2016 | Su | F21V 9/16 |
| 9,520,573 B2* | 12/2016 | Zhou | H01L 51/4233 |
| 2005/0129947 A1* | 6/2005 | Peng | B82Y 15/00 428/403 |
| 2005/0206755 A1* | 9/2005 | Yokoyama | B82Y 10/00 348/272 |
| 2008/0237611 A1 | 10/2008 | Cok et al. | |
| 2008/0238299 A1 | 10/2008 | Cho | |
| 2009/0278141 A1* | 11/2009 | Coe-Sullivan | B82Y 20/00 257/89 |
| 2010/0283005 A1 | 11/2010 | Pickett | |
| 2012/0138894 A1* | 6/2012 | Qian | H01L 51/502 257/13 |
| 2012/0292594 A1* | 11/2012 | Zhou | H01L 51/4233 257/13 |
| 2013/0069036 A1* | 3/2013 | Miyata | B82Y 20/00 257/13 |
| 2013/0112940 A1 | 5/2013 | Kurtin et al. | |
| 2014/0022779 A1* | 1/2014 | Su | F21V 9/16 362/231 |
| 2014/0166973 A1* | 6/2014 | Kurtin | H01L 33/005 257/13 |
| 2015/0349285 A1 | 12/2015 | Seo et al. | |
| 2016/0172513 A1 | 6/2016 | Williams | |
| 2016/0233449 A1 | 8/2016 | Murayama et al. | |

OTHER PUBLICATIONS

Anikeeva et al., "Quantum Dot Light-Emitting Devices with Electroluminescence Tunable over the Entire Visible Spectrum", Nano Letters, vol. 9, No. 7, Jul. 8, 2009, pp. 2532-2536, XP055067500, ISSN: 1530-6984, DOI: 10.1021/nl9002969; -& Anikeeva et al., "Supporting Information. I Synthesis", Nano Letters, Jun. 10, 2009, pp. 1-8, XP055368719, Retrieved from the Internet on May 2, 2017: URL:http://pubs.acs.orq/doi/suool/10.1021 /nl9002969/suool file/ nl9002969 si 001.pdf.

Brine, Hicham, et al, "Ionic liquid modified zinc oxide injection layer for inverted organic light-emitting diodes," Organic Electronics, vol. 14, Issue 1, Jan. 2013, pp. 164-168, ISSN 1566-1199, Retrieved Jul. 28, 2016 from http://www.researchgate.net/publication/ 257628380.

Hou et al., "Magnetic properties of n-type Cu-doped ZnO thin films", 2007, Applied Physics Letters, vol. 90, pp. 142502-1-142502-4, published on Apr. 2, 2007.

Kim, J. H., et al. "High-Performance and Environmentally Stable Planar Heterojunction Perovskite Solar Cells Based on a Solution-Processed Copper-Doped Nickel Oxide Hole-Transporting Layer," 2015, Adv. Mater., 27: 695-701, doi: 10.1002/adma.201404189.

Kuang et al., "Optical Properties of Ultraviolet Quantum Dot Light-Emitting Devices Using ZnO-Cores With a MgO-Shell", Journal of Display Technology, IEEE Service Center, New York, NY, US, vol. 11, No. 5, May 5, 2015, pp. 461-465, XP011579913.

Mashford et al., "All-inorganic quantum-dot light-emitting devices formed via low-cost, wet-chemical processing", Journal of Materials Chemistry, vol. 20, No. 1, Aug. 5, 2009, pp. 167-172, XP055368715.

Murugadoss Structural and optical properties of monodispersed ZnS/CdS/ZnO and ZnO/ZnS/CdS nanoparticles, Journal of Luminescence, Elsevier by North-Holland, NL, vol. 132, No. 10, Mar. 27, 2012, pp. 2665-2669, XP028505202.

Park, Mi-Hyae, et al. "Doping of the Metal Oxide Nanostructure and its Influence in Organic Electronics," Adv. Funct. Mater. 2009, 19, 1241-1246.

PCT International Search Report and Written Opinion for International Application No. PCT/US2017/015467, dated Jun. 13, 2017, 21 pages.

Yang et al., "Solution Processed Tungsten Oxide Interfacial Layer for Efficient Hole-Injection in Quantum Dot Light-Emitting Diodes", Small, vol. 10, No. 2, Jan. 5, 2014, pp. 247-252, XP055331882.

PCT/US2017/015467 International Preliminary Report on Patentability, dated Sep. 27, 2018, 13 pgs.

\* cited by examiner

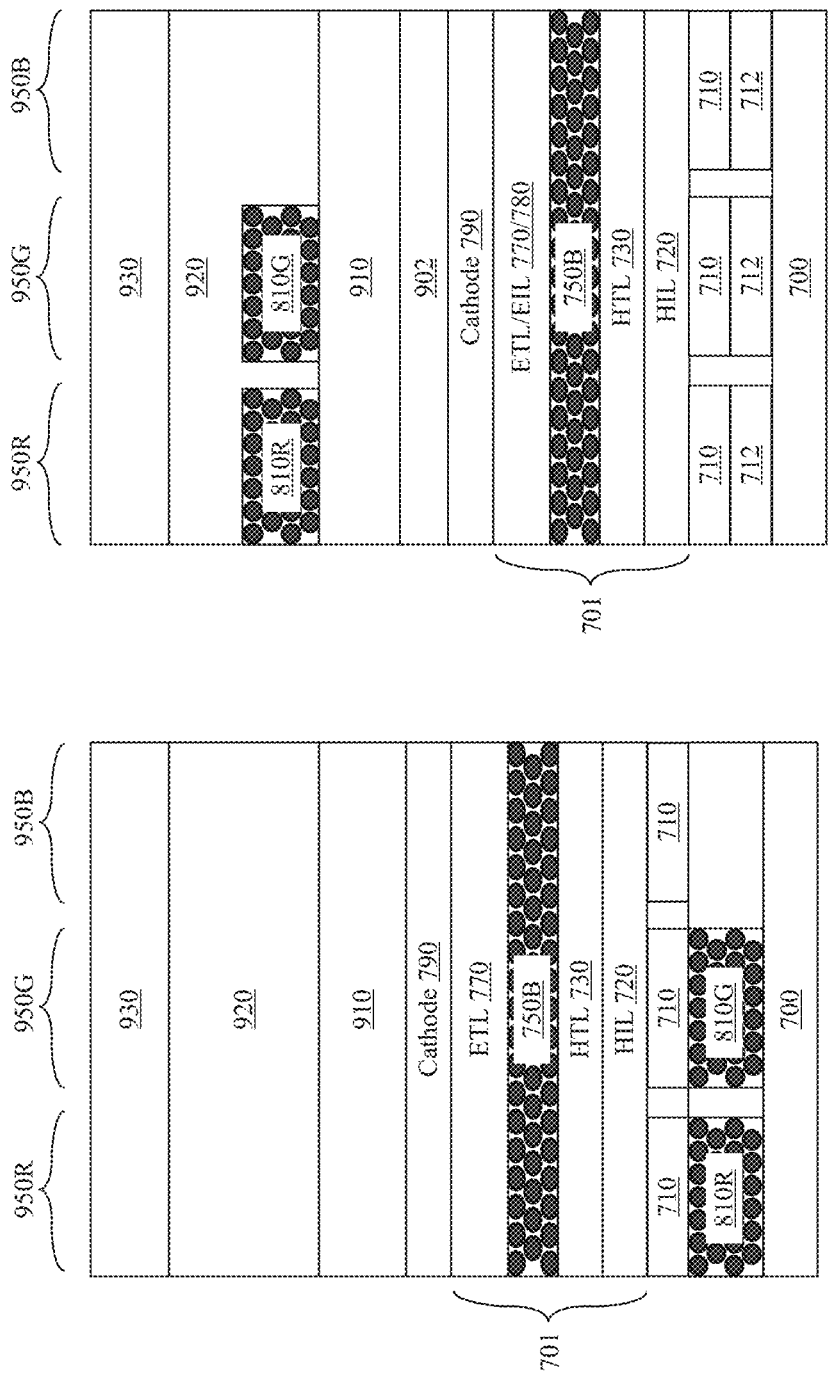

INVERTED
BOTTOM EMISSION STRUCTURE

INVERTED
TOP EMISSION STRUCTURE

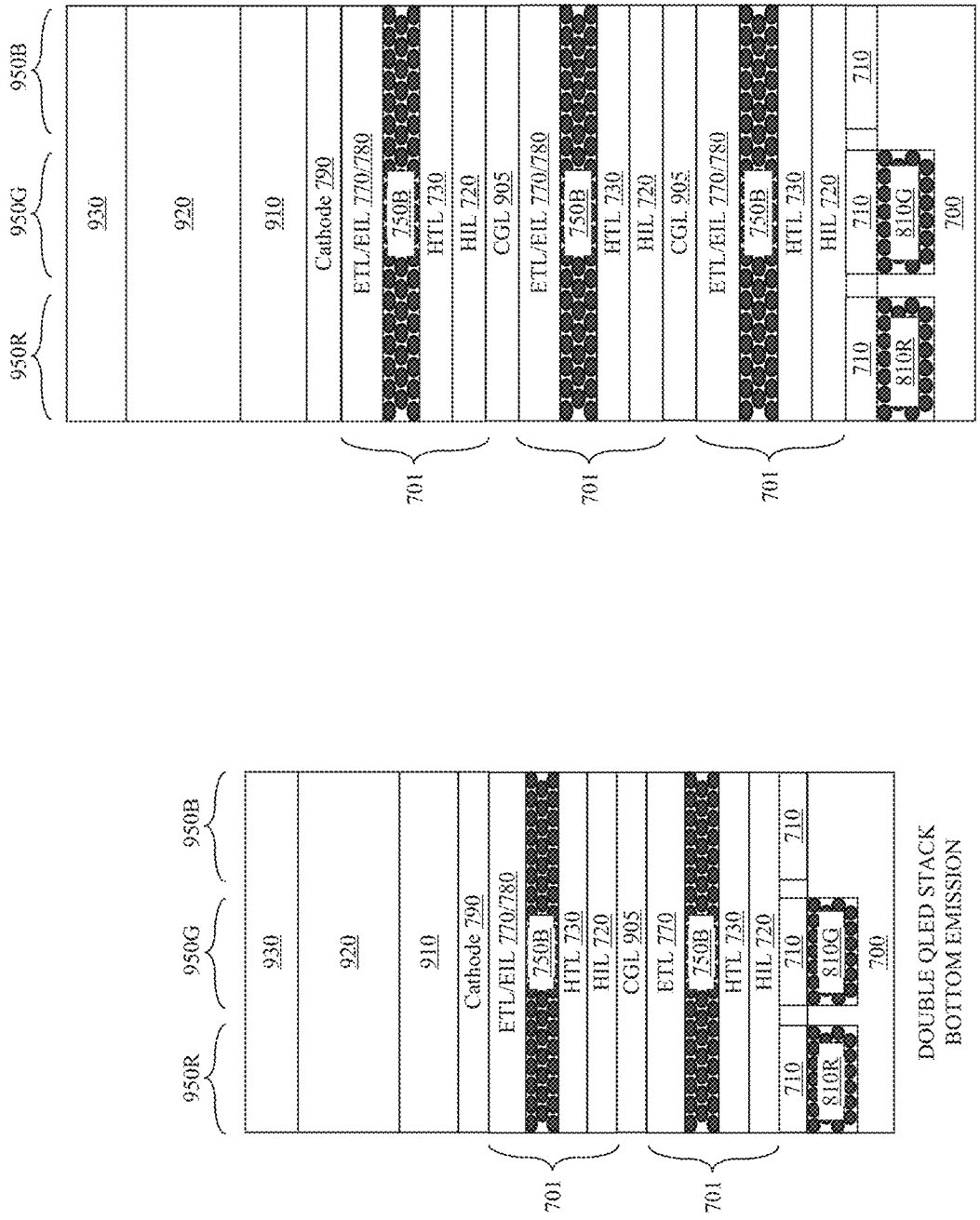

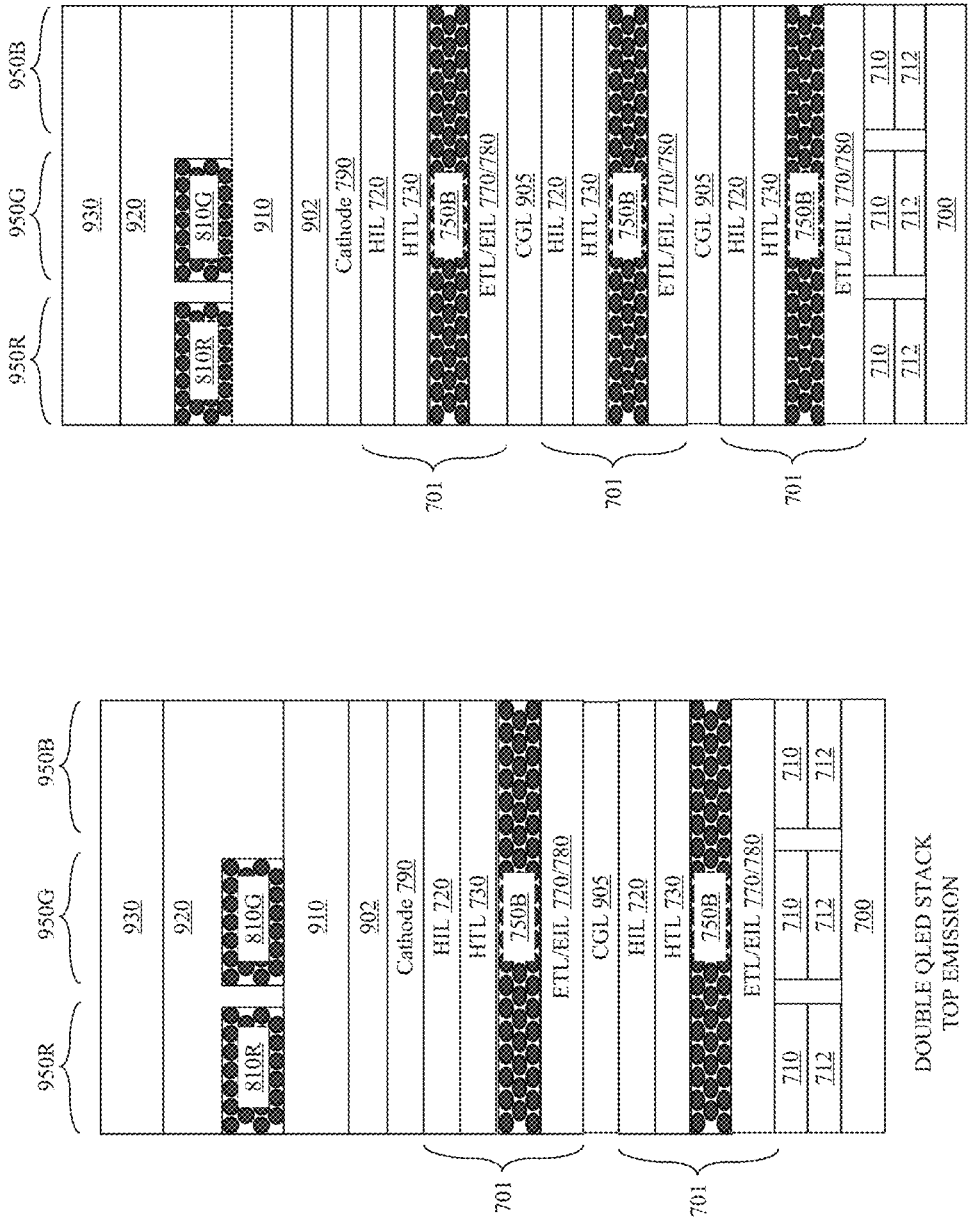

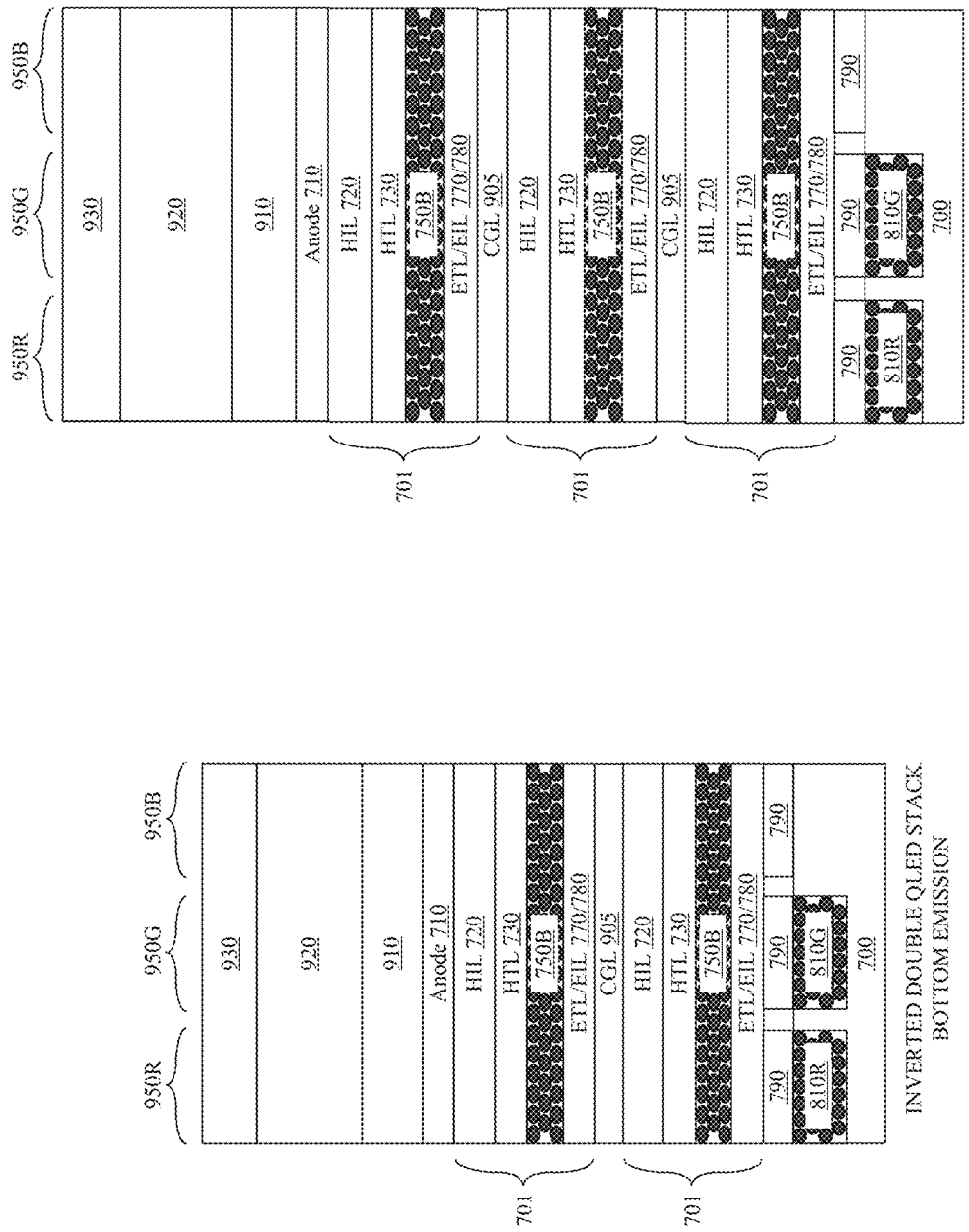

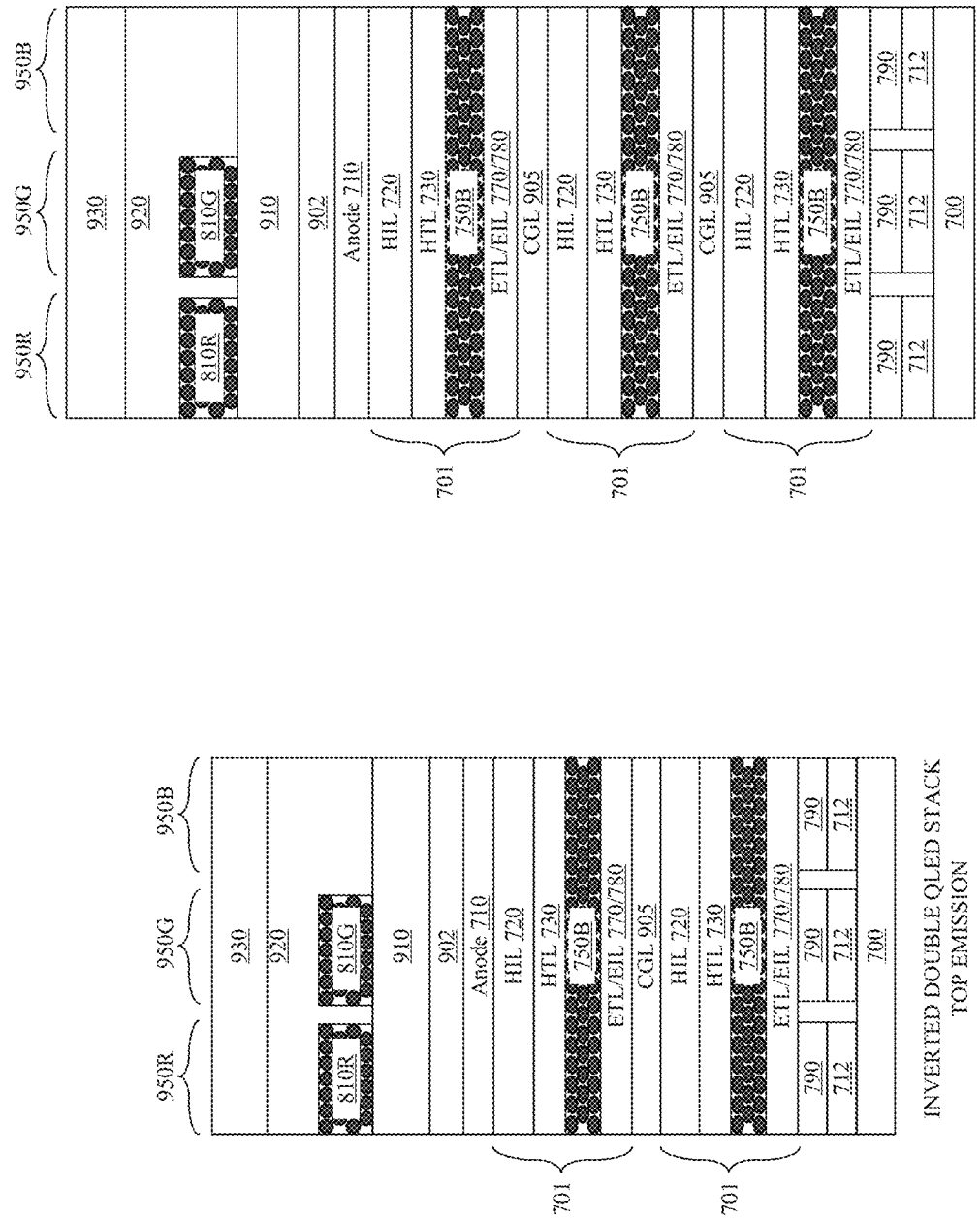

QUANTUM DOT SPACING FOR HIGH EFFICIENCY QUANTUM DOT LED DISPLAYS

RELATED APPLICATIONS

This application is a continuation-in part of pending U.S. patent application Ser. No. 15/192,938 filed Jun. 24, 2016 and claims the benefit of priority of U.S. Provisional Application No. 62/309,768 filed Mar. 17, 2016 and U.S. Provisional Application No. 62/351,739 filed Jun. 17, 2016, all of which are incorporated herein by reference.

BACKGROUND

Field

Embodiments described herein relate to quantum dots. More particularly, embodiments relate to quantum dots in quantum dot LED displays.

Background Information

State of the art displays for phones, tablets, computers and televisions utilize glass substrates with thin-film transistors (TFTs) to control transmission of backlight through pixels based on liquid crystals. More recently emissive displays such as those based on organic light emitting diodes (OLED) have been introduced because they can have a faster response time, and be more power efficient, allowing each pixel to be turned off completely when displaying black or dark colors. Even more recently, quantum dot light emitting diodes (QD-LEDs) have been introduced as an alternative display technology, potentially being more power efficient than OLEDs.

Quantum dots are semiconductor materials where the size of the structure is small enough (e.g. less than tens of nanometers) that the electrical and optical characteristics differ from the bulk properties due to quantum confinement effects. For example, the emission properties of quantum dots are related to their size and shape in addition to their composition. When an electric field is applied to a QD-LED electrons and holes move into the quantum dot layer where the electrons and holes are captured in the quantum dots and recombine, emitting photos. The emission wavelength can be tuned by changing the size of the quantum dots. Typically, smaller quantum dots emit bluer light (higher energy) and larger quantum dots emit redder light (lower energy).

SUMMARY

Quantum dot (QD) layers and QD-LED display structures are described. In an embodiment, a QD layer includes a matrix of quantum dots in which each quantum dot includes a core, a shell around the core, and a coating around the shell. In an embodiment, the shells of adjacent quantum dots are spaced apart by an average distance of 0.5-10 nm, for example, to mitigate the impact of Forster resonance energy transfer (FRET) within the QD layer. In an embodiment, the coatings of the quantum dots are metal oxide coatings that have an average thickness of 2.5-5 nm. In such a configuration, the shells of adjacent quantum dots may be spaced apart by an average distance of 5-10 nm, for example. In an embodiment, the coatings are core-material coatings that have an average thickness of 0.25-1.5 nm. In such a configuration, the shells of adjacent quantum dots may be spaced apart by an average distance of 0.5-3.0 nm, for example.

In an embodiment, a quantum dot LED display subpixel includes a bottom electrode layer, a hole transport layer over the bottom electrode layer, a QD layer over the hole transport layer, an electron transport layer over the QD layer, and a top electrode layer over the electron transport layer. The QD layer may include a matrix of QDs including a core, a shell around the core, and a coating around the shell. In accordance with embodiments, the shells of adjacent QDs are spaced apart by an average distance of 0.5 nm-10 nm. In an embodiment, the electron transport layer includes a first type of inorganic material (e.g. first type of metal oxide particles). Similarly, the hole transport layer includes a second type of inorganic material (e.g. second type of metal oxide particles). In a particular configuration, the QD layer is directly on the hole transport layer, and the electron transport layer is directly on the QD layer.

In some embodiments, the QD layer includes a matrix of QDs including a core, a shell around the core, and a core-material coating around the shell. By way of example, the core may be formed of a core material such as CdS, CdSe, CdTe, ZnS, ZnSe, ZnTe, GaAs, GaP, GaAs, GaSb, HgS, HgSe, HgTe, InAs, InP, InSb, AlAs, AlP, AlSb, InGaP, ZnSeTe, ZnCdS, ZnCdSe, and CdSeS. The shell may be formed of a shell material different from the core material, and the core-material coating may be formed of the same material as the core. In an embodiment, the shells of adjacent QDs are spaced apart by an average distance of 0.5 nm-3.0 nm. For example, this may be achieved with core-material coatings that have an average thickness of 0.25 nm-1.5 nm. In accordance with embodiments core-material coatings may be thicker than 1.5 nm. The quantum dot LED displays in accordance with embodiments, may additionally include a photoluminescent QD layer over or under the QD layer to down convert light emitted from the QD layer.

The QD layer may additionally include a second matrix of QDs dispersed in the first matrix of QDs, where the QDs in the second matrix of QDs are smaller than the QDs in the matrix of QDs. In one configuration, the QDs in the second matrix of QDs include ligands bound to shells of the QDs in the second matrix of QDs.

In an embodiment, a QD-LED display subpixel includes a hole transport layer and a QD layer over the hole transport layer, an electron transport layer over the QD layer, and a top electrode layer over the electron transport layer. The QD layer includes a matrix of QDs including a core, a shell around the core, and a metal oxide coating around the shell. The QD layer is characterized by a conduction band within 1.0 eV, or more specifically within 0.5 eV of a conduction band or lowest unoccupied molecular orbital (LUMO) of the electron transport layer, or a valence band within 1.0 eV, or more specifically within 0.5 eV of a valence band or highest occupied molecular orbital (HOMO) of the hole transport layer. In accordance with embodiments, the shells of adjacent QDs may be spaced apart by an average distance of 5-10 nm, and the metal oxide coatings of the QDs may have an average thickness of 2.5-5 nm.

In an embodiment, the hole transport layer includes metal oxide particles, and the QD layer is characterized by a valence band within 1.0 eV, or more specifically within 0.5 eV of a valence band of the hole transport layer. For example, the QD metal oxide coating may be the same material as the hole transport layer metal oxide particles. In an embodiment, the QD-LED display subpixel additionally includes an electron blocking layer between hole transport layer and the QD layer, wherein the electron blocking layer has a valence band within 1.0 eV, or more specifically within 0.5 eV of the valence band or HOMO of the hole transport layer. In an embodiment, the part of, or whole part of hole transport layer and/or electron blocking layer metal oxide particles are doped with a p-type dopant.

In an embodiment, the electron transport layer includes metal oxide particles, and the QD layer is characterized by a conduction band within 1.0 eV, or more specifically within 0.5 eV of a conduction band of the electron transport layer. For example, the QD metal oxide coating may be the same material as the electron transport layer metal oxide particles. In an embodiment, the QD-LED display subpixel additionally includes a hole blocking layer between electron transport layer and the QD layer, wherein the hole blocking layer has a conduction band within 1.0 eV of the conduction band or HOMO of the electron transport layer. In an embodiment, the part of, or whole part of electron transport layer and/or electron blocking layer metal oxide particles are doped with an n-type dopant.

The QD layer may also be formed of a bipolar metal oxide material. In an embodiment, the hole transport layer includes a first type of metal oxide particles (e.g. hole transporting material), the electron transport layer includes a second type of metal oxide particles (e.g. electron transporting material), and the QD layer is characterized by a valence band within 1.0 eV, or more specifically within 0.5 eV of a valence band of the hole transport layer and a conduction band within 1.0 eV, or more specifically within 0.5 eV of a conduction band of the electron transport layer.

The QD layer of the QD-LED display subpixel may additionally include multiple layers. In an embodiment, the hole transport layer includes a first type of metal oxide particles, the electron transport layer includes a second type of metal oxide particles, the QD layer includes a first QD layer and a second QD layer over the first QD layer, in which the first QD layer includes a first type of QDs with a first metal oxide coating, and the second QD layer includes a second type of QDs with a second metal oxide coating. In such a configuration, the first QD layer may be characterized by a valence band within 1.0 eV, or more specifically within 0.5 eV of a valence band of the hole transport layer, and the second QD layer may be characterized by a conduction band within 1.0 eV, or more specifically within 0.5 eV of a conduction band of the electron transport layer.

In an embodiment, the QD layer includes a third QD layer between the first QD layer and the second QD layer, in which the third QD layer includes a mixture of the first type of QDs and the second type of QDs. In an embodiment, the QD layer includes a third QD layer between the first QD layer and the second QD layer, in which the third QD layer is characterized by a valence band within 1.0 eV, or more specifically within 0.5 eV of a valence band of the hole transport layer and conduction band within 1.0 eV, or more specifically within 0.5 eV of a conduction band of the hole transport layer.

In an embodiment, the QD-LED display subpixel is incorporated into a QD-LED display in which the QD layer is an electroluminescent quantum dot (ELQD) layer, and the subpixel further includes a photoluminescent quantum dot (PLQD) layer over or under the QD layer to down convert light emitted from the QD layer. Location of the PLQD layer may be attributed to whether the QD-LED display is a top emission, bottom emission, or inverted structure. For example, in an exemplary top emission structure, the subpixel may additionally include a passivation layer over the top electrode layer, and a PLQD layer over the passivation layer, and directly over the QD layer to down convert light emitted from the QD layer.

In an embodiment, a QD-LED display subpixel includes a hole transport layer and a QD layer over the hole transport layer, an electron transport layer over the quantum dot layer, and a top electrode layer over the electron transport layer. The QD layer includes a matrix of QDs including a core, a shell around the core, and a metal oxide coating around the shell. In an embodiment, the metal oxide coating includes a material such as NiO, Cu2O, WO3, SnOx, Cr2O3, V2O5, MoO3, ReO3, ZnO, ZrO2, Nb2O3, Sb2O3, Cr2O3, In2O3, Nb2O3, Sb2O3, BiVO4, and SrTiO3, and at least one of the hole transport layer includes ZnO, NiO, Cu2O, WO3, SnOx, Cr2O3, V2O5, MoO3, or ReO3, or the electron transport layer includes ZnO, ZrO2, Nb2O3, Sb2O3, Cu2O, or 12CaO.7Al2O3. In accordance with embodiments, the shells of adjacent QDs may be spaced apart by an average distance of 5-10 nm, and the metal oxide coatings of the QDs may have an average thickness of 2.5-5 nm.

In an embodiment, the metal oxide coating includes ZnO, NiO, Cu2O, WO3, SnOx, Cr2O3, V2O5, MoO3, or ReO3, and the hole transport layer includes metal oxide particles formed of ZnO, NiO, Cu2O, WO3, SnOx, Cr2O3, V2O5, MoO3, or ReO3.

In an embodiment, the metal oxide coating includes ZnO, ZrO2, Nb2O3, Sb2O3, Cu2O, or 12CaO.7Al2O3, and the electron transport layer includes metal oxide particles formed of ZnO, ZrO2, Nb2O3, Sb2O3, Cu2O, or 12CaO.7Al2O3.

In an embodiment, the metal oxide coating is formed of a bipolar material such as NiO, Cr2O3, In2O3, Nb2O3, Sb2O3, BiVO4, or SrTiO3, the hole transport layer includes metal oxide particles formed of ZnO, NiO, Cu2O, WO3, SnOx, Cr2O3, V2O5, MoO3, or ReO3, and the electron transport layer includes metal oxide particles formed of ZnO, ZrO2, Nb2O3, Sb2O3, Cu2O, or 12CaO.7Al2O3.

The materials forming the HTL and/or ETL (e.g. the metal oxide particles, etc.) may optionally be doped to increase hole or electron carrier mobility and to block transport of electron or hole carriers. For example, the HTL may be a p-type film, and may be doped with a p-type dopant. The ETL may be an n-type film, and may be doped with an n-type dopant. In one embodiment, the doping may be implemented by adding a solution of Cs2CO3 to the metal oxide precursor solution. The electron and hole transport layers may be designed to provide approximately balanced injection and transport of electrons and holes, respectively, to optimize device efficiency and stability.

In an embodiment, the quantum dot LED display subpixel includes an electron blocking layer between hole transport layer and the quantum dot layer, in which the electron blocking layer includes particles formed of a material selected from the group consisting of CuAlO2, SrCu2O2, HfO2, Nd2O3, Ga2O3, ZrO2, SrSnO3, CsSnO3, Ta2O5, SiC, GaP, GaN, MnS, MAPbBr3, and EAPbI3. 30. In an embodiment, the quantum dot LED display subpixel includes a hole blocking layer between electron transport layer and the quantum dot layer, in which the hole blocking includes particles formed of a material selected from the group consisting of SnOx, In2O3, ZnO, ZrO2, SrTiO3, MgTiO3, MnO, Cr2O3, KTaO3, and Bi2O3.

The QD layer of the QD-LED display subpixel may additionally include multiple layers. In an embodiment, the QD layer includes a first QD layer and a second QD layer over the first QD layer, the first QD layer includes a first type of QDs with a first metal oxide coating formed of ZnO, NiO, Cu2O, WO3, SnOx, Cr2O3, V2O5, MoO3, or ReO3, the second QD layer includes a second type of QDs with a second metal oxide coating formed of ZnO, ZrO2, Nb2O3, Sb2O3, Cu2O, or 12CaO.7Al2O3.

In an embodiment, the QD layer includes a third QD layer between the first QD layer and the second QD layer, in which the third QD layer includes a mixture of the first type of QDs and the second type of QDs. In an embodiment, the QD layer includes a third QD layer between the first QD layer and the second QD layer, in which the third QD layer is includes a third type of QDs with a third metal oxide coating formed of NiO, Cr2O3, In2O3, Nb2O3, Sb2O3, BiVO4, or SrTiO3.

In an embodiment, the QD-LED display subpixel is incorporated into a QD-LED display in which the QD layer is an electroluminescent quantum dot (ELQD) layer, and the subpixel further includes a photoluminescent quantum dot (PLQD) layer over or under the QD layer to down convert light emitted from the QD layer. Location of the PLQD layer may be attributed to whether the QD-LED display is a top emission, bottom emission, or inverted structure. For example, in an exemplary top emission structure, the subpixel may additionally include a passivation layer over the top electrode layer, and a PLQD layer over the passivation layer, and directly over the QD layer to down convert light emitted from the QD layer.

In an embodiment, QD-LED display pixels include an electroluminescent quantum dot (ELQD) subpixel and one or more photoluminescent quantum dot (PLQD) subpixels. A common ELQD-LED stack spans across both the ELQD subpixel and the PLQD subpixel(s). The common ELQD-LED stack includes a hole transport layer (HTL), a QD layer, and an electron transport layer (ETL), though other layers may be included. One or more photoluminescent quantum dot (PLQD) layers is on the ELQD-LED stack in the one or more PLQD subpixels to down convert light emitted from the common ELQD-LED stack. In an embodiment, the QD layer is characterized by a conduction band within 1.0 eV, or more specifically within 0.5 eV of a conduction band or LUMO of the ETL, or a valence band within 1.0 eV, or more specifically within 0.5 eV of a valence band or HOMO of the HTL. The QD layer may include a matrix of quantum dots including a core, a shell around the core, and a metal oxide coating around the shell. The shells of adjacent quantum dots may be spaced apart by an average distance of 5-10 nm in some embodiments. In an embodiment, the QD layer includes a matrix of QDs including a core, a shell around the core, and a metal oxide coating around the shell, and the metal oxide coating includes a material such as NiO, Cu2O, WO3, SnOx, Cr2O3, V2O5, MoO3, ReO3, ZnO, ZrO2, Nb2O3, Sb2O3, Cr2O3, In2O3, Nb2O3, Sb2O3, BiVO4, SrTiO3, or 12CaO.7Al2O3, and either the HTL includes a material such as ZnO, NiO, Cu2O, WO3, SnOx, Cr2O3, V2O5, MoO3, or ReO3, or the ETL includes a material such as ZnO, ZrO2, Nb2O3, Sb2O3, Cu2O, or 12CaO.7Al2O3.

Embodiments describe QD-LED displays which may be top emission and/or bottom emission, the electrode configurations may or may not be inverted, and may or may not include tandem ELQD-LED stacks. In an embodiment a bottom emission QD-LED display includes a display substrate, a PLQD layer over the display substrate, a first electrode over the PLQD layer and the display substrate, a second electrode over the display substrate, a common ELQD-LED stack over and spanning across the first anode and the second anode, and a common electrode layer over the common ELQD-LED stack. A tandem stack bottom emission quantum dot LED display may additionally include one or more common ELQD-LED stacks over and spanning across the common ELQD-LED stack and underneath the common electrode layer.

In an embodiment a top emission QD-LED display includes a display substrate, a first electrode and a second electrode over the display substrate, a common ELQD-LED stack over the first electrode and the second electrode, a common electrode layer over the common ELQD-LED stack, and a PLQD layer over the common electrode layer.

A tandem stack top emission QD-LED display may additionally include one or more common ELQD-LED stack overs and spanning across the common ELQD-LED stack and underneath the common electrode layer.

BRIEF DESCRIPTION OF THE DRAWINGS

FIG. 12 is a schematic side view illustration of a subpixel arrangement for a bottom emission QD-LED display in accordance with an embodiment.

FIG. 13 is a schematic side view illustration of a subpixel arrangement for a top emission QD-LED display in accordance with an embodiment.

FIGS. 16-17 are schematic side view illustration of subpixel arrangements for tandem structure stack bottom emission QD-LED displays in accordance with embodiments.

FIGS. 18-19 are schematic side view illustration of subpixel arrangements for tandem structure stack top emission QD-LED displays in accordance with embodiments.

FIGS. 20-21 are schematic side view illustration of subpixel arrangements for inverted tandem structure stack bottom emission QD-LED displays in accordance with embodiments.

FIGS. 22-23 are schematic side view illustration of subpixel arrangements for inverted tandem structure stack top emission QD-LED displays in accordance with embodiments.

DETAILED DESCRIPTION

Figure 1:
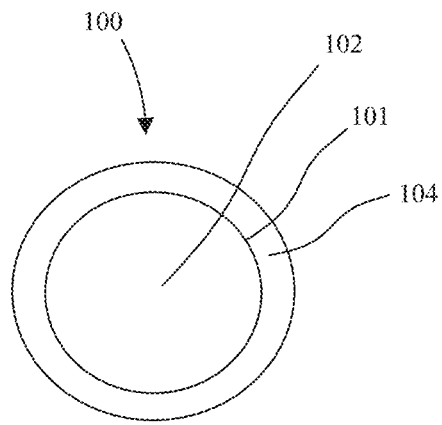
FIG. 1 is a schematic cross-sectional view illustration of a quantum dot including a core and shell surrounding the core.

Embodiments describe quantum dot (QD) layers and QD-LED stacks, for example, within displays. In an embodiment, a QD-LED display subpixel includes a hole transport layer (HTL) and a QD layer over the HTL. The QD layer includes a matrix of QDs, each including a core, a shell around the core, and a coating around the shell. An electron transport layer (ETL) is formed over the QD layer, and a top electrode layer is formed over the ETL. In some embodiments, the ETL and/or HTL are inorganic layers. For example, they may include metal oxide particles. In an embodiment, the QD layer is formed directly on the HTL, and the ETL is formed directly on the QD layer.

In an embodiment, the shells of adjacent quantum dots are spaced apart by an average distance of 0.5-10 nm. For example, this may be achieve by providing coatings around the shell layers such as a metal oxide coating or core-material coating. In an embodiment, the core-material coatings of the quantum dots have an average thickness of 0.25 nm-1.5 nm, or more. In such an embodiment, adjacent shell spacing within a QD layer may average 0.5-3.0 nm, or more. In an embodiment, the metal oxide coatings of the quantum dots have an average thickness of 2.5-5 nm. In such an embodiment, adjacent shell spacing within a QD layer may average 5-10 nm. In an embodiment, the quantum dot layer is characterized by a conduction band within 1.0 eV, or more specifically within 0.5 eV of a conduction band or LUMO of the ETL, or a valence band within 1.0 eV, or more specifically within 0.5 eV of a valence band or HOMO of the HTL. In one aspect, matching the energy levels of the QD layer metal oxide coating and the adjacent HTL and/or ETL may facilitate meeting of the electrons and holes and generation of an exciton in the emission layers of the QDs. In another aspect, the matching of energy levels may facilitate increasing the recombination zone and increasing lifetime of the QD-LEDs.

In an embodiment, a QD-LED display includes a pixel having an electroluminescent quantum dot (ELQD) subpixel and a photoluminescent quantum dot (PLQD) subpixel. The quantum dot LED display may include a common ELQD-LED stack spanning across both the ELQD subpixel and the PLQD subpixel. The common ELQD-LED stack may include a HTL, QD layer, and ETL. For example the QD layer may include a metal oxide coating as described above, and may have an energy level matched to the HTL and/or ETL as described above to facilitate radiative recombination and/or increasing the recombination zone. In accordance with embodiments, a PLQD layer is formed on the ELQD-LED stack in the PLQD subpixel to down convert light emitted from the common ELQD-LED stack.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known display processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One layer "over", "spanning" or "on" another layer may be directly in contact with the other layer or may have one or more intervening layers. One layer "between" layers may be directly in contact with the layers or may have one or more intervening layers.

It has been observed that close packed films of QDs may exhibit lower luminescence efficiency and stability than QDs in solution or in a polymer where they are significantly further apart from one another. In accordance with embodiments, QD films are engineered, for application as QD-LED devices for example, where the QD semiconductor layers (e.g. QD shells) are separated by a distance of 0.5-10 nm, or more particularly 5-10 nm, where the efficiency of Forster resonance energy transfer (FRET) can be significantly reduced, thereby reducing QD luminescence quenching and increasing device lifetime and efficiency.

FRET is a mechanism that describes how a donor chromophore in its electronic excited state may transfer energy to an acceptor chromophore through nonradiative dipole-dipole coupling. The efficiency of this energy transfer is inversely proportional to the sixth power of the distance between the donor and acceptor, making FRET extremely sensitive to small changes in distance. In accordance with some embodiments, metal oxide coatings are formed around the QD shells in order to achieve a desired thickness to reduce FRET. Metal oxide coatings can be deposited using suitable deposition techniques in which thickness is closely controlled to achieve a threshold amount of reduction in FRET. In some embodiments, metal oxide coating thickness on the quantum dots is an average 2.5-5 nm. In accordance with other embodiments, core-material coatings can be formed around the QD shells to also reduce FRET. Such core-material coatings can be formed utilizing traditional synthetic (wet) chemistry used to form the QDs, thus providing a convenient processing sequence. In some embodiments, core-material coating thickness on quantum dots is an average of 0.25-1.5 nm. Functionally, the core-material coating may be thin enough to not significantly change physics and optical properties of the QDs, while being thick enough to provide some reduction in FRET, particularly considering the efficiency of energy transfer being inversely proportional to the sixth power of the distance between donor and acceptor.

Figure 2:
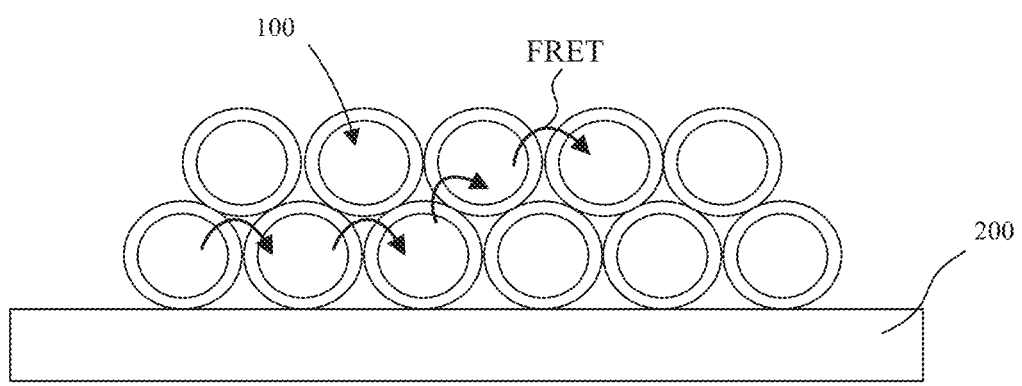
FIG. 2 is a schematic cross-sectional view illustration of a neat film of quantum dots.

In order to illustrate the impact of FRET, a schematic cross-sectional view illustration of a quantum dot including a core and shell surrounding the core is provided in FIG. 1, and a cross-sectional view illustration of a neat film of quantum dots is provided in FIG. 2. In the example provided, a quantum dot 100 may conventionally include a core 102 and a shell 104 surrounding a surface 101 of the core.

Examples of quantum dot materials include, but are not limited to, groups of II-VI, III-V, IV-VI semiconductor materials. Some exemplary compound semiconductors include CdS, CdSe, CdTe, ZnS, ZnSe, ZnTe, GaAs, GaP, GaAs, GaSb, HgS, HgSe, HgTe, InAs, InP, InSb, AlAs, AlP, AlSb. Some exemplary alloyed semiconductors include InGaP, ZnSeTe, ZnCdS, ZnCdSe, and CdSeS. A semiconductor shell can be grown onto the semiconductor core to protect and passivate the core. The semiconductor shell increases the core emission efficiency and stability. Multi-shell structures are also possible. Exemplary multi-shell configurations may include a semiconductor core material, a first shell material grown onto the core, followed by a second shell material, and so on to enhance the luminescence properties. The shell may function to absorb light at a specific spectrum that is different from the emission spectrum from the quantum dot. The core and shell layers may be formed of the same material or different materials, and may be formed of any of the exemplary compound semiconductors or alloyed semiconductors listed above.

Referring back to FIG. 2, it has been observed that close packed films of QDs are unstable and limit control over the QD excitation mechanism. For example, FRET may enable excitons to sample on average 5-10 QDs in a close-packed film before emitting. As a result, this increases the probability of an exciton to land on an "off" QD.

Figure 3A:
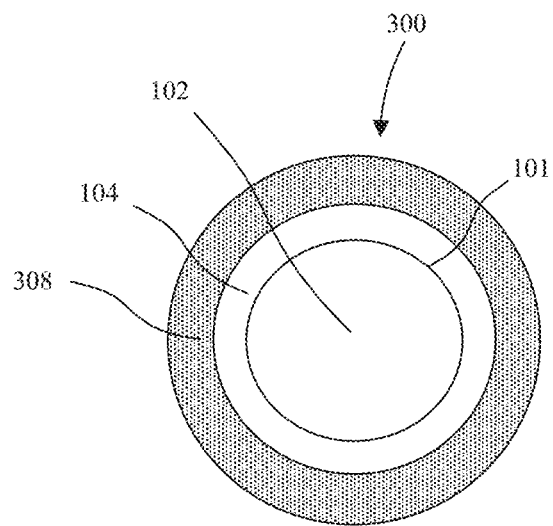
FIG. 3A is a schematic cross-sectional view illustration of a quantum dot including a metal oxide coating surrounding the shell in accordance with an embodiment.
Figure 3B:
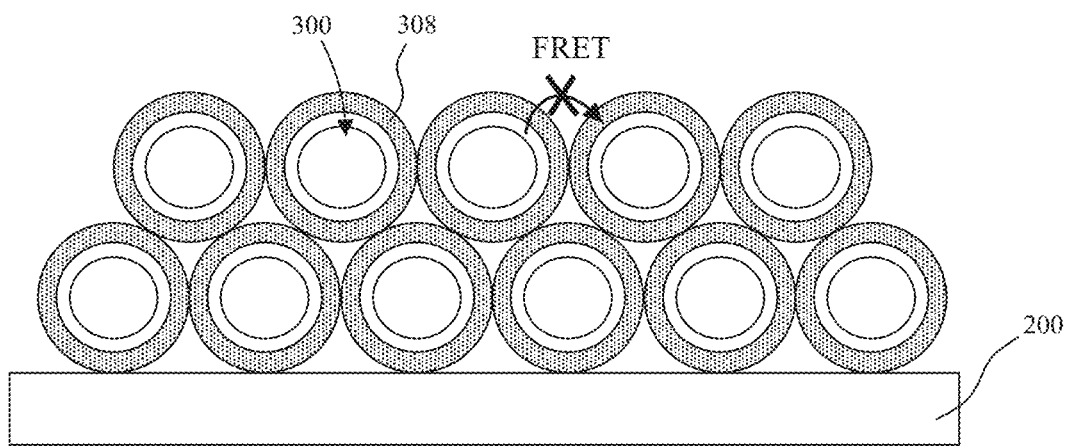
FIG. 3B is a schematic cross-sectional view illustration of quantum dot film in which adjacent quantum dots are spaced apart by their metal oxide coatings in accordance with an embodiment.

Referring now to FIGS. 3A-3B, in accordance with some embodiments, a metal oxide coating 308 is provided on the quantum dot 300 to provide physical separation from the semiconductor layers (e.g. shell 104 layers) of adjacent quantum dots in a thin film of close packed nanoparticles. As shown, the metal oxide coating 308 may be grown onto the semiconductor core-shell QD. In an embodiment, the shells 104 (or outermost semiconductor layer) of adjacent QDs are spaced apart by an average distance of 5-10 nm. In an embodiment, the metal oxide coatings 308 of the quantum dots 300 have an average thickness of 2.5-5 nm. At these distances, FRET may be mitigated or eliminated within the QD layer. This may increase device efficiency, as well as stability of the QD layer. Suitable metal oxide coating in accordance with embodiments include, but are not limited to, ZnO, ZrO2, Nb2O3, Sb2O3, NiO, Cu2O, WO3, SnOx, Cr2O3, V2O5, MoO3, ReO3, Cr2O3, In2O3, Nb2O3, Sb2O3, BiVO4, SrTiO3, and 12CaO.7Al2O3.

Figure 4A:
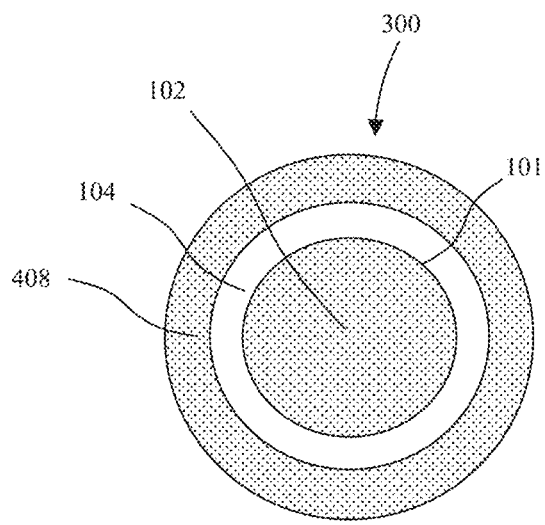
FIG. 4A is a schematic cross-sectional side view illustration of a quantum dot including a core-material coating surrounding the shell in accordance with an embodiment.
Figure 4B:
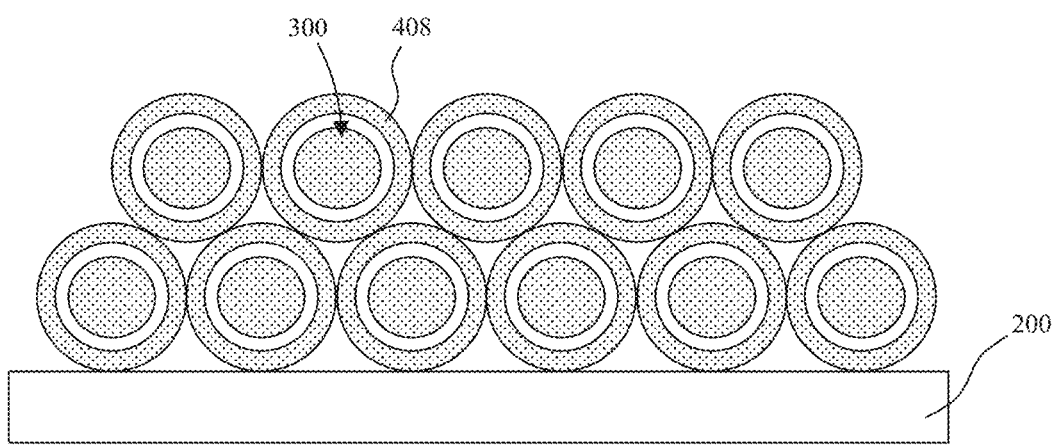
FIG. 4B is a schematic cross-sectional view illustration of quantum dot film in which adjacent quantum dots are spaced apart by their core-material coatings in accordance with an embodiment.

Referring now to FIGS. 4A-4B, in accordance with some embodiments, a core-material coating 408 is provided on the quantum dot 300 to provide physical separation from the semiconductor layers (e.g. shell 104 layers) of adjacent quantum dots in a thin film of close packed nanoparticles. As shown, the core-material coating 408 may be grown onto the semiconductor core-shell QD. In an embodiment, the shells 104 of adjacent QDs are spaced apart by an average distance of 0.5-3 nm. In an embodiment, the core-material coatings 408 of the quantum dots 300 have an average thickness of 0.25-1.5 nm. At these distances, FRET may be mitigated within the QD layer. In an embodiment, the core is formed of a core material such as CdS, CdSe, CdTe, ZnS, ZnSe, ZnTe, GaAs, GaP, GaAs, GaSb, HgS, HgSe, HgTe, InAs, InP, InSb, AlAs, AlP, AlSb, InGaP, ZnSeTe, ZnCdS, ZnCdSe, and CdSeS, the shell is formed of a shell material that is different than the core material, and the core-material coating is the same as the core material.

Figure 5A:
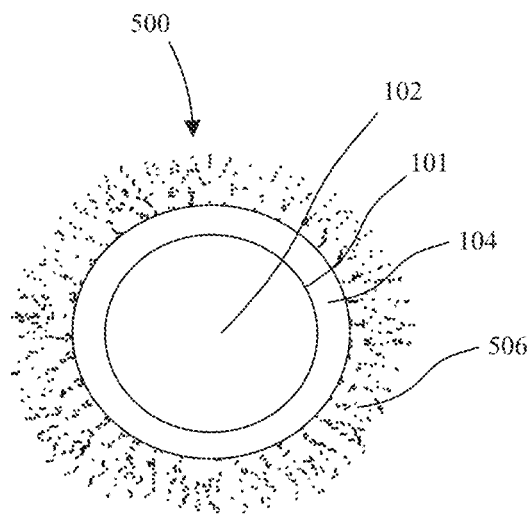
FIG. 5A is a schematic cross-sectional view illustration of a quantum dot including ligands bound to the shell.
Figure 5B:
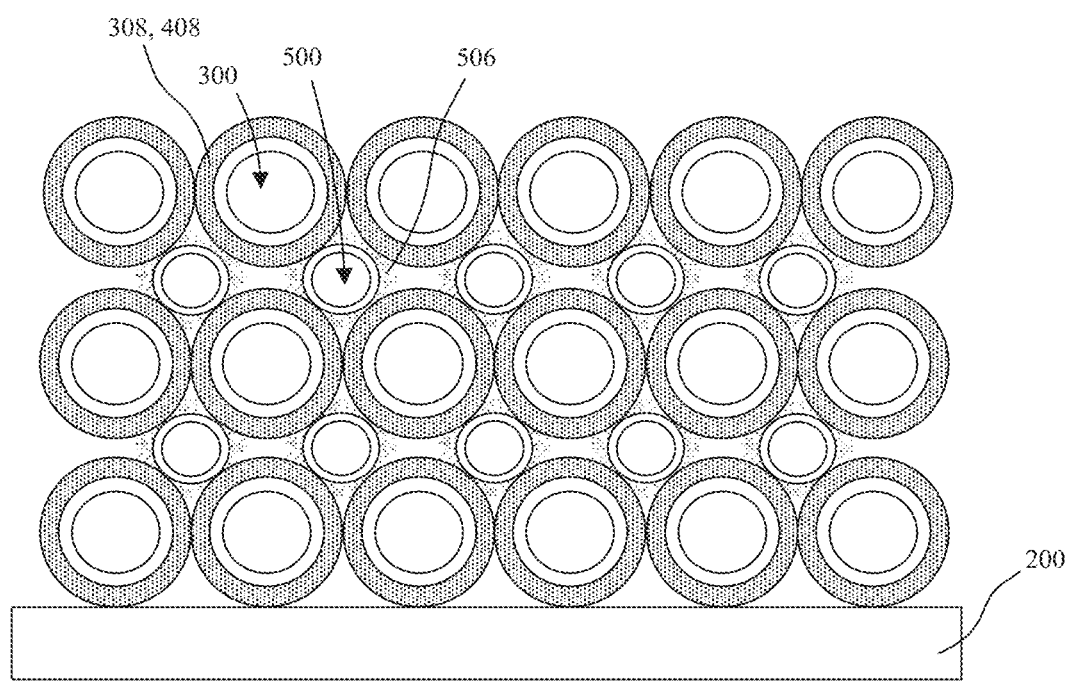
FIG. 5B is a schematic cross-sectional view illustration of quantum dot film including a mixture of quantum dots with coatings and quantum dots with ligands in accordance with an embodiment.

Referring now to FIGS. 5A-5B, in an embodiment, a QD layer may include a second matrix of QDs 500 dispersed in a first matrix of QDs 300. As shown, the QDs 500 of the second matrix may be smaller than the QDs 300. Additionally, the QDs 500 may include organic or inorganic ligands 506 bound to the shells 104 of the QDs 500. In an embodiment, a QD layer including a mixture of semiconductor core-shell QDs 100, 500 with metal oxide coated or core-materials coated QDs 300 may create spacing between QDs to mitigate or eliminate FRET. Such a mixture may additionally create carrier trap sites (e.g. charge trapping sites on the emitter for electrons and holes) on the QDs 100, 500, which may enhance QD excitation in the device.

In another aspect, the metal oxide coatings 308 may be a material system that is QD-LED device compatible. In accordance with embodiments, the metal oxide coatings 308 may create a charge transporting matrix that may have the effect of increasing a recombination zone. As a result, device efficiency and lifetime may additionally be extended. A variety of metal oxide materials may be used based on band gap and band position relative to surrounding layers within a QD-LED device. In some embodiments, the metal oxide coating 308 material may be selected to be within a specified energy level of an adjacent HTL or ETL, both of which may be formed of organic or inorganic materials. For example, the metal oxide coating 308 material may have a conduction band within 1.0 eV, or more specifically within 0.5 eV of a conduction band or LUMO of an adjacent ETL, or a valence band within 1.0 eV, or more specifically within 0.5 eV of a valence band or HOMO of an adjacent HTL. Conventionally, HOMO and LUMO are used to characterize organic semiconductors, while valence band and conduction band are used to characterize inorganic materials such as semiconductors and metal oxides.

Referring now to FIGS. 6-11B various energy diagrams are provided of QD-LED stack structures in accordance with embodiments. In the following description, layers that may be common to, or optional, within FIGS. 6-11B are described together. In interest of clarity, the general description of the QD-LED layers is made with regard to FIG. 6, including QD layer 756, however it is to be understood that the generalized description is applicable to multiple embodiments, including FIGS. 6-11B. As shown, a QD-LED stack may include an anode 710, a hole injection layer (HIL) 720 on/over the anode 710, a hole transport layer (HTL) 730 on/over the HIL 720, a QD layer 756 on/over the HTL 730, an electron transport layer (ETL) 770 on/over the QD layer 756, an electron injection layer (EIL) 780 on/over the ETL 770, and a cathode 790 on/over the EIL 780. As described and illustrated herein a layer on/over another layer may be directly on (in contact) with the other layer or may have or more intervening layers. In operation, a voltage is applied across the QD-LED stack such that the anode is positive with respect to the cathode. Current flows through the QD-LED stack from the cathode to anode, as electrons are injected from the cathode 790 into the conduction band of the QD layer 756, while electrons are withdrawn toward the anode 710 from the valence band of the QD layer 756. Recombination of electrons and holes in the QD layer 756 is accompanied by emission of radiation, the frequency of which dependent upon the band gap of the QDs, or the difference in energy (eV) between the conduction band and the valence band. It is to be appreciated that the particular energy levels illustrated in FIGS. 6-11B are exemplary, and that the energy levels are variable. Accordingly, the particular energy levels illustrated are provided for illustrative purposes only, and embodiments are not limited to the specific energy levels illustrated.

In accordance with the embodiments, the QD layers (e.g. 756, 752, 754) are described as being characterized as having a conduction band or valence band value within specified amount (e.g. 1.0 eV, or more specifically within 0.5 eV) of the conduction band/LUMO or valence band/HOMO of an adjacent HTL 740 or ETL 760, or other QD layer. As used herein the conduction band or valence band values of the QD layers (e.g. 756, 752, 754) substantially correspond to that of the metal oxide coatings 308, and therefore these terms are used interchangeably. Similarly, the conduction band/LUMO or valence band/HOMO values of the ETL 760 or HTL 740 substantially correspond to that of their constituent materials, and therefore these terms are used interchangeably.

Figure 6:
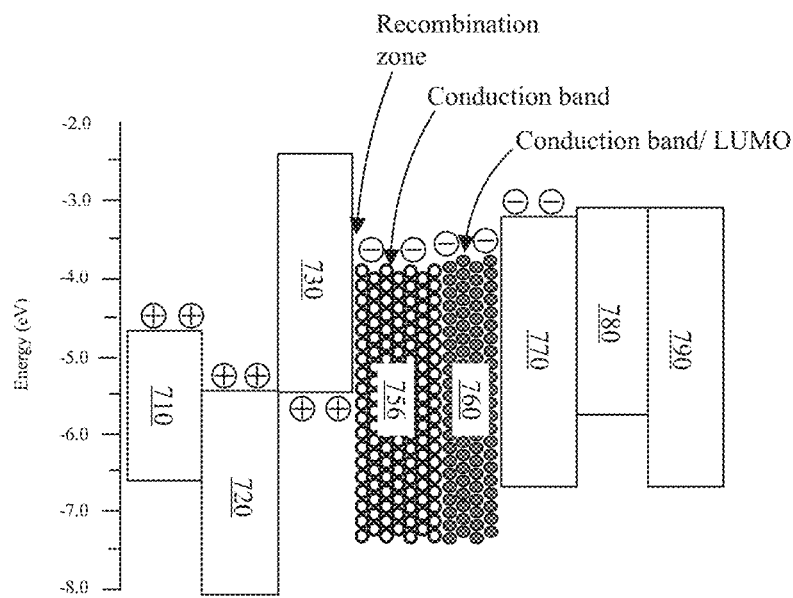
FIG. 6 is an energy diagram of the layers in a QD-LED stack including a QD layer conduction band aligned with the conduction band or LUMO of an electron transport layer in accordance with an embodiment.

Still referring to FIG. 6, an anode 710 is formed on a display substrate, such as a TFT substrate, or substrate including redistribution lines. Anode 710 may be formed of a variety of electrically conductive materials. In an embodiment, anode 710 is formed of indium-tin-oxide (ITO). For example, ITO may be formed by sputtering or thermal evaporation. In an embodiment, an array of anodes 710 is sputtered onto a display substrate through a mask, such as a fine metal mask, with a separate anode 710 formed in each subpixel.

As shown, a HIL 720 is formed on the anode 710. In accordance with embodiments, the HIL 720 may be a common layer shared by multiple subpixels within a pixel, and may be a common layer across multiple pixels. The HIL 720 facilitates the injection of positive charge (holes) from the anode 710 into the HTL 730. The HIL 720 may be formed of materials such as conductive polymer-based materials (e.g. poly thiophenes, poly anilines), combination of arylamine based hole transport host and electron accepting dopant (e.g. charge transfer salts), strongly electron accepting small organic molecules, metal oxides. The HIL 720 may be formed using techniques such as spin coating, ink jet printing, slot die coating, nozzle printing, contact printing, gravure printing, any solution printing technology, as well as thermal evaporation.

As shown, a HTL 730 is optionally formed on the HIL 720. In accordance with embodiments, the HTL 730 may be a common layer shared by multiple subpixels within a pixel, and may be a common layer across multiple pixels. The HTL 730 transports positive charge (holes) to the QD layer 756, the emissive layer in the QD-LED stack, and physically separates the HIL 720 from the QD layer 756. HTL 730 may be formed of electron rich organic small molecules such as arylamines, polyfluorene derivatives or organic polymer materials. For example, HTL 730 may be formed with other materials such as inorganic metal oxides or semiconductor nanoparticles or inorganic metal oxide or semiconductor sol-gel materials. The HTL 730 may be formed using techniques such as spin coating, ink jet printing, slot die coating, nozzle printing, contact printing, gravure printing, any solution printing technology, as well as thermal evaporation.

As shown, a QD layer 756 is formed on the optional HTL 730. In accordance with embodiments, the QD layer 756 may be formed or patterned only in separate subpixel. The QD layer 756 may include QDs 300 as described with regard to FIGS. 3A-5B. The QD layer 756 may be formed using techniques such as spin coating, ink jet printing, slot die coating, nozzle printing, contact printing, gravure printing, and any solution printing technology. In an embodiment QD layer 756 may be formed by transfer printing an array of QD layers 756 into an array of subpixels.

As shown, an ETL 770 is optionally formed on the QD layer 756. In accordance with embodiments, the ETL 770 may be a common layer shared by multiple subpixels within a pixel, and may be a common layer across multiple pixels. The ETL 770 may be a high electron mobility layer that transports negative charge (electrons) into the QD layer 756 and physically separates the EIL 780 from the QD layer 756. ETL 770 may be formed of electron deficient organic small molecules (e.g. substituted benzimidazoles), inorganic metal oxides or semiconductor nanoparticles, inorganic metal oxide or semiconductor sol-gel materials, organometallic compounds, and organic polymers. The ETL 770 may be formed using techniques such as spin coating, ink jet printing, slot die coating, nozzle printing, contact printing, gravure printing, any solution printing technology, as well as thermal evaporation.

As shown, an EIL 780 is formed on the optional ETL 770. In accordance with embodiments, the EIL 780 may be a common layer shared by multiple subpixels within a pixel, and may be a common layer across multiple pixels. The EIL 780 facilitates the injection of negative charge (electrons) from the cathode 790 into the ETL 770. EIL 780 may be formed of alkali metal salts such as LiF, low work function metals such as Ca, Ba, and n-doped material (e.g. combination of electron transport material and electron donating material). In an embodiment, the EIL 780 is formed by thermal evaporation.

As shown, a cathode 790 is formed on the EIL 780. Cathode 790 may be formed of a variety of electrically conductive materials, including transparent or semi-transparent materials. In accordance with embodiments, the cathode 790 may be a common layer shared by multiple subpixels within a pixel, and may be a common layer across multiple pixels. In an embodiment, cathode 790 is formed of materials such as Ca/Mg, Sm/Au, Yb/Ag, Ca/Ag, Ba/Ag, and Sr/Ag. For example, in a double layer Ca/Mg the Ca layer has a low work-function for electron injection, whereas a Mg capping layer improves electrical conductance of the cathode 790. In an embodiment, cathode 790 is formed by thermal evaporation.

Referring now specifically to FIG. 6, in an embodiment the QD-LED stack optionally includes ETL 760 on the QD layer 756. For example, ETL 760 may be formed in place of ETL 770, or in addition to ETL 770 as illustrated. In some embodiments, the optional ETL 760 is not present. ETL 760 may be formed using a technique such as spin coating, ink jet printing, slot die coating, nozzle printing, contact printing, gravure printing, and any solution printing technology. In an embodiment ETL 760 may be formed by transfer printing an array of ETLs 760 into an array of subpixels. In an embodiment, transfer printing includes transferring an ETL 760/QD layer 756 stack.

In an embodiment, the ETL 760 includes a film of inorganic metal oxide, perovskite, metal, or other inorganic material (e.g. metal sulfides, inorganic semiconductors) made via sol-gel, epitaxially grown, MOCVD, CVD, sputtered, etc. which may be particles (including nanoparticles or larger particles). The QD layer 756 may be characterized by a conduction band within 1.0 eV, or more specifically within 0.5 eV of a conduction band of the ETL 760. For example, ETL 760 may include a film or particles formed of a material such as ZnO, $ZrO_2$, $Nb_2O_3$, $Sb_2O_3$, $Cu_2O$, and 12CaO.7Al2O3. The QD layer 756 may include QDs 300 including a metal oxide coating 308 formed of a material such as ZnO, ZrO2, Nb2O3, Sb2O3, Cu2O, or 12CaO.7Al2O3. The metal oxide coating 308 can also be formed of a bipolar material in which alignment of the conduction and valence bands enable both electron and hole transport. Suitable bipolar materials include NiO, Cr2O3, In2O3, Nb2O3, Sb2O3, BiVO4, and SrTiO3. In an embodiment, the QD 300 metal oxide coating 308 is the same material as the ETL 760 metal oxide particles.

The ETL 760 may additionally be partly or wholly (e.g. uniformly) doped, which may increase carrier mobility and potentially have the effect of reducing driving voltage and increasing luminous efficiency. For example, a doped ETL 760 may be a thin film of inorganic metal oxide, perovskite, ionic liquids, cesium compounds, or other inorganic material (e.g. metal sulfides, inorganic semiconductors) made via sol-gel, epitaxially grown, MOCVD, CVD, sputtered, etc. which may be particles (including nanoparticles or larger particles). In one embodiment, Cs2CO3 in solution is introduced into the sol-gel metal oxide precursor in order to facilitate fabrication of a doped transport layer. In another embodiment, an ionic liquid may be used to dope the metal oxide to facilitate electron injection and transport. Most ZnO may have an n-type character, even in the absence of intentional doping. Nonstoichiometry (having elemental composition whose proportions cannot be represented by integers; most often, in such materials, some small percentage of atoms are missing or too many atoms are packed into an otherwise perfect lattice) is typically the origin of n-type character. Alternatively, unintentional substitutional hydrogen impurities could be responsible. Controllable n-type doping of ZnO may be achieved by substituting Zn with a group-Ill element such as Al, Ga, In or by substituting oxygen with group-VII elements such as chlorine or iodine. Cu2O is commonly a p-type, direct wide band gap oxide semiconductor that can be n-type when doped with chorine or bromine. N-type ZrO2 can be made by doping cetrimonium bromide (CTAB) into the oxide. Another example is doping ZrO2 with Al to achieve n-type ZrO2. Another examples is CaO.Al2O3 composite, C12A7. The sputter target is commercially available from AGC. HOMO-LUMO of C12A7 is 7.9 eV and 3 eV respectively. C12A7 can be formed as metal oxide particle as well.

In an embodiment, the QD layer 756 is characterized by a conduction band within 1.0 eV, or more specifically within 0.5 eV of a LUMO of the ETL 760. For example, ETL 760 may be formed of organometallic compounds, organic polymers, and organic small molecules (e.g. substituted benzimidazoles).

In the embodiment illustrated in FIG. 6, the HTL 730 and QD layer 756 may act as blocking layers to the flow of electrons and holes, respectively. Accordingly, the recombination zone illustrated in FIG. 6 may be located nearer the junction of HTL 730 and QD layer 756. In an embodiment, the inclusion of a bipolar material metal oxide coating 308 (e.g. NiO, Cr2O3, In2O3, Nb2O3, Sb2O3, BiVO4, or SrTiO3) may potentially increase the recombination zone, which can potentially increase the lifetime of the QD layer 756.

Figure 7:
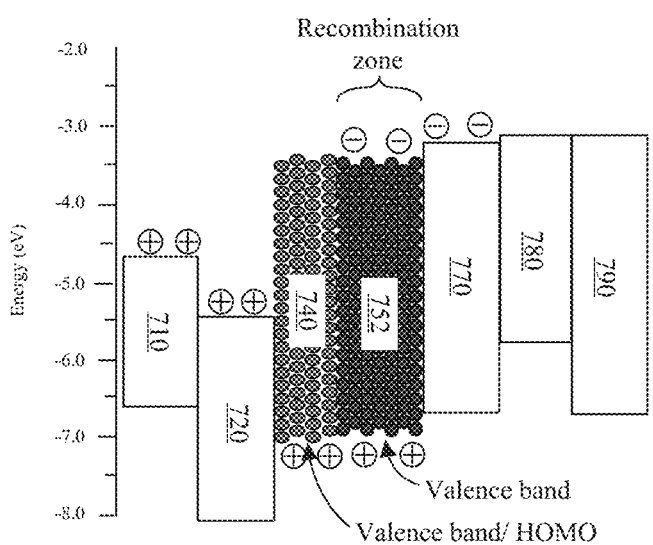
FIG. 7 is an energy diagram of the layers in a QD-LED stack including a QD layer valence band aligned with the valence band or HOMO of a hole transport layer in accordance with an embodiment.

Referring now specifically to FIG. 7, in an embodiment the QD-LED stack includes a QD layer 752 on an optional HTL 740. While not separately illustrated, HTL 730 may optionally be present. In an embodiment, HTL 740 is formed using a technique such as spin coating, ink jet printing, slot die coating, nozzle printing, contact printing, gravure printing, and any solution printing technology. In an embodiment HTL 740 may be formed by transfer printing an array of HTLs 740 into an array of subpixels. In an embodiment, transfer printing includes transferring an HTL 740/QD layer 752 stack.

In an embodiment, the HTL 740 includes a film of inorganic metal oxide, perovskite, metal, or other inorganic material (e.g. metal sulfides, inorganic semiconductors) made via sol-gel, epitaxially grown, MOCVD, CVD, sputtered, etc. which may be particles (including nanoparticles or larger particles). The QD layer 752 may be characterized by a valence band within 1.0 eV, or more specifically within 0.5 eV of a valence band of the HTL 740. For example, HTL 740 may include a film or particles formed of a material such as ZnO, NiO, Cu2O, WO3a, SnOx, Cr2O3, V2O5, MoO3, and ReO3. The QD layer 752 may include QDs 300 including a metal oxide coating 308 formed of a material such as ZnO, NiO, Cu2O, WO3, SnOx, Cr2O3, V2O5, MoO3, and ReO3. The metal oxide coating 308 can also be formed of a bipolar material in which alignment of the conduction and valence bands enable both electron and hole transport. Suitable bipolar materials include NiO, Cr2O3, In2O3, Nb2O3, Sb2O3, BiVO4, and SrTiO3. In an embodiment, the QD 300 metal oxide coating 308 is the same material as the HTL 740 metal oxide particles. In the embodiments illustrated in FIG. 7, alignment of the valence bands of HTL 740 and QD layer 752 is illustrated as allowing the flow holes into the QD layer 752, thereby widening the recombination zone.

The HTL 740 may additionally be partly or wholly (e.g. uniformly) doped, which may increase carrier mobility and potentially have the effect of reducing driving voltage and increasing luminous efficiency. For example, a doped HTL 740 may be a thin film of inorganic metal oxide, perovskite, or other inorganic material (e.g. metal sulfides, inorganic semiconductors) made via sol-gel, epitaxially grown, MOCVD, CVD, sputtered, etc. which may be particles (including nanoparticles or larger particles). In one embodiment, copper may be used to dope a metal oxide such as nickel oxide NiOx materials to facilitate hole transport. P-type doping of ZnO may need to compensate for n-type character with p-type dopants such as group-I elements (Li, Na, K), group-V elements (N, P, As), as well as copper and silver. ZnO can also p-type doped using a co-doping method, for example, Zr—N co-doping, Ga—N co-doping, V-N co-doping, and P—N co-doping. Sb can also be doped into ZnO to form p-type ZnO.

Stoichiometric NiO may also show p-type electrical conduction due to the introduction of Ni2+ vacancies and self doping of Ni3+ ions in the presence of excess oxygen. The electrical conductivity may be enhanced with p-type dopants such as Co, Li, or Al.

Additional materials for HTL 740 include Cu2O (p-type doped with N, O, Li, or Na), SnOx (doped with N, Al, Li, AlN, or Mn to form a p-type film), and Cr2O3 (doped with Mg, Mg—N co-doping, Ni, or Li to form a p-type film). V2O5 may show p-type conductivity when doped with Mn2+. BiVO4 may show p-type conductivity by extrinsic doping with Sr, Ca, Na, and K atoms.

In an embodiment, the QD layer 756 is characterized by a valence band within 1.0 eV, or more specifically within 0.5 eV of a HOMO of the HTL 740. For example, HTL 740 may be formed or organic small molecules or organic polymers such as arylamines, polyfluorene derivatives.

Figure 8:
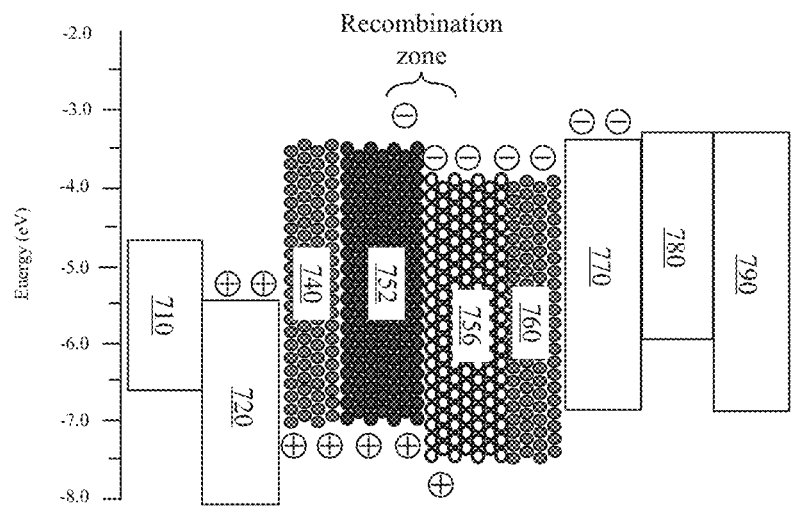
FIGS. 8-9 are energy diagrams of the layers in a QD-LED stack including multiple energy level alignments in accordance with embodiments.

Referring now specifically to FIG. 8, in an embodiment the QD-LED stack includes a QD layer 752 on a HTL 740 as described above with regard to FIG. 7 and additionally an ETL 760 on a QD layer 756 as described above with regard to FIG. 6. In such an embodiment, it is believed a recombination zone may span at least partially across both QD layers 752, 756.

Figure 9:
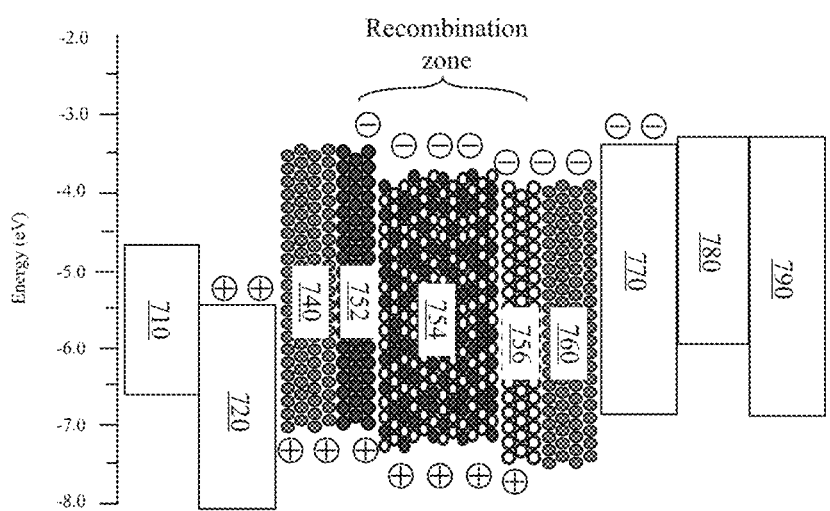

FIG. 9 is an illustration of an additional modification to the embodiment illustrated in FIG. 8. In the particular embodiment illustrated an additional QD layer 754 is inserted between QD layers 752 and 756. In an embodiment, the QD layer 754 includes a mixture of the first type of QDs that form QD layer 752 and the second type of QDs that form QD layer 756. For example, QD layer 752 may include QDs with metal oxide coatings 308 formed of ZnO, NiO, Cu2O, WO3, SnOx, Cr2O3, V2O5, MoO3, or ReO3, while QD layer 756 includes QDs with metal oxide coatings 308 formed of formed of ZnO, ZrO2, Nb2O3, Sb2O3, Cu2O, or 12CaO.7Al2O3. In an embodiment, the QD layer 754 includes QDs with bipolar metal oxide coatings (e.g. NiO, Cr2O3, In2O3, Nb2O3, Sb2O3, BiVO4, SrTiO3).

Figure 10:
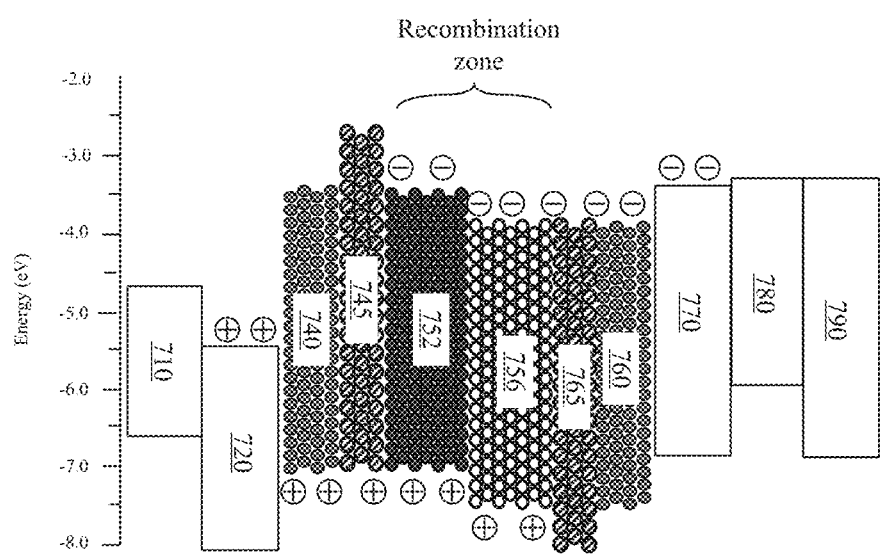
FIG. 10 is an energy diagram of a QD-LED stack including electron and hole blocking layers in accordance with an embodiment.

FIG. 10 is an illustration of QD-LED stack including an electron blocking layer (EBL) 745 and a hole blocking layer (HBL) 765 in accordance with an embodiment. While the QD-LED stack illustrated in FIG. 10 is shown as a modification of the stack illustrated and described with regard to FIG. 8, this is exemplary, either or both of the EBL 745 and HBL 765 can be included in any of the QD-LED stacks illustrated and described with regard to FIGS. 6-11B. In accordance with embodiments, the EBL 745 and/or HBL 765 may reduce carrier leakage and confine excitons in the emission layer, resulting in higher efficiency. Furthermore, the EBL 745 and/or HBL 765 may broaden the recombination zone, and facilitate a longer operational lifetime.

In an embodiment, the EBL 745 has a valence band within 1.0 eV, or more specifically within 0.5 eV of a valence band/HOMO of an adjacent HTL 740/730. In an embodiment, the EBL 745 has a conduction band that is greater than 0.5 eV, or more specifically greater than 1.0 eV, than a conduction band/LUMO of an adjacent HTL 740/730. The EBL 745 may have a carrier mobility equivalent to that of the adjacent HTL 740/730. In an embodiment, the EBL 745 has a thickness of 5 to 20 nm.

In an embodiment, the HBL 765 has a conduction band within 1.0 eV, or more specifically within 0.5 eV of a conduction band/LUMO of an adjacent ETL 760/770. In an embodiment, the HBL 765 has a valence band that is greater than 0.5 eV, or more specifically greater than 1.0 eV, than a valence band/HOMO of an adjacent ETL 760/770. The HBL 765 may have a carrier mobility equivalent to that of the adjacent ETL 760/770. In an embodiment, the HBL 765 has a thickness of 5 to 20 nm.

The EBL 745 and HBL 765 may each include a film of inorganic metal oxide, perovskite, or other inorganic material (e.g. metal sulfides, inorganic semiconductors) made via sol-gel, epitaxially grown, MOCVD, CVD, sputtered, etc. which may be particles (including nanoparticles or larger particles).

Exemplary EBL 745 metal oxide materials include CuAlO2, SrCu2O2, HfO2, Nd2O3, Ga2O3, ZrO2, SrSnO3, CsSnO3, Ta2O5. Other EBL 745 inorganic materials may include, but are not limited to, SiC, GaP, GaN, MnS. Exemplary EBL 745 large band gap perovskites include MAPbBr3, EAPbI3. Exemplary HBL 765 metal oxide materials include SnOx, In2O3, ZnO, ZrO2, SrTiO3, MgTiO3, MnO, Cr2O3, KTaO3, Bi2O3.

The EBL 745 may be partially or wholly (e.g. uniformly) doped, for example with p-dopants. The HBL 765 may be partially or wholly (e.g. uniformly) doped, for example with n-dopants. However, embodiments are not so limited, and the EBL 745 and HBL 765 may be n-doped or p-doped.

Figure 11A:
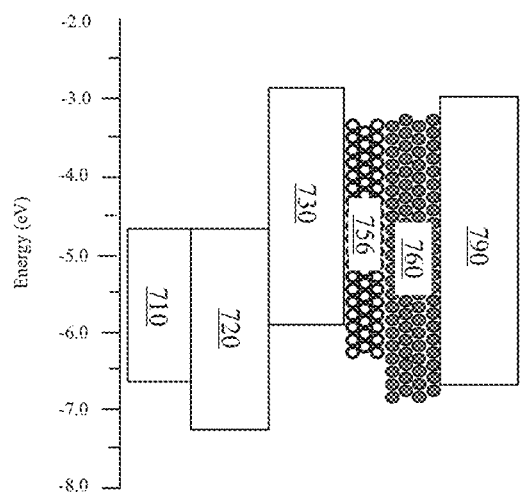
FIG. 11A is an energy diagram of a QD-LED stack including an inorganic electron transport layer in accordance with an embodiment.
Figure 11B:
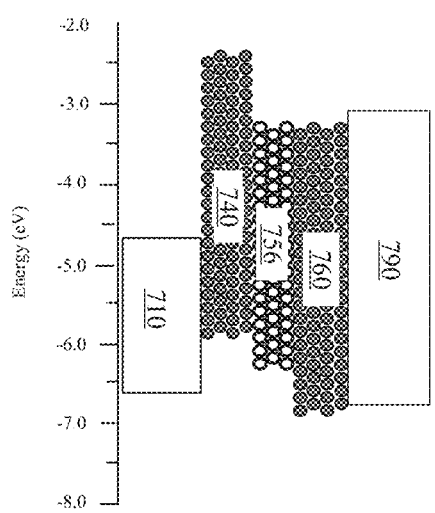
FIG. 11B is an energy diagram of a QD-LED stack including inorganic electron transport and hole transport layers in accordance with an embodiment.

Referring now to FIGS. 11A-11B energy diagrams are provided of QD-LED stacks including an inorganic ETL 760 (FIG. 11A), and inorganic ETL 760 and inorganic HTL 740 (FIG. 11B) in accordance with embodiments. In the embodiment illustrated in FIG. 11A, the HTL 730 may be formed of a material with a deep HOMO/valence band, for example, within 1.0 eV of the valence band of the QD layer 756, or more specifically within 0.5 eV of the valence band of the QD layer 756. In the embodiment illustrated in FIG. 11B, an inorganic HTL 740 may be formed of a material with a valence band within 1.0 eV of the valence band of the QD layer 756, or more specifically within 0.5 eV of the valence band of the QD layer 756. Referring to both FIG. 11A and FIG. 11B, an inorganic ETL 760 may be formed of a material with a conduction band within 1.0 eV of the conduction band of the QD layer 756, or more specifically within 0.5 eV of the conduction band of the QD layer 756.

In an embodiment, a quantum dot LED display subpixel includes a bottom electrode layer 710, a HTL 730, 740 over the bottom electrode layer 710, and QD layer 756 over the HTL 730, 740, an ETL 760 over the QD layer 756, and a top electrode layer 790 over the ETL 760. The QD layer 756 may include a matrix of QDs 300 including a core, a shell around the core, and a coating around the shell. For example, the coating may be a metal oxide coating or core-material coating as previously described, and shells of adjacent QD's may optionally be spaced apart by an average distance of 0.5 nm-10 nm.

In an embodiment, the HIL 720, HTL 730, QD layer 756, and ETL 760 illustrated in FIG. 11A are all solution-based layers. In an embodiment, the HTL 740, QD layer 756, and ETL 760 illustrated in FIG. 11B are all solution-based layers. In an embodiment, the QD layer 765 is directly on the HTL 740, and the ETL 760 is directly on the QD layer 756.

Referring now to FIGS. 12-23 various schematic side view illustrations are provided of QD-LED display subpixel arrangements including a red-emitting subpixel, a green-emitting subpixel, and a blue-emitting subpixel for exemplary RGB pixel arrangements. In particular, the QD-LED structures illustrated and described with regard to FIGS. 1-11B may be implemented in a display as an electroluminescent QD emission structure, as well as a photon source for a photoluminescent QD emission structure. Additionally, the QD layer structures including QD spacing and metal oxide coatings may be implemented into QD layers for both electroluminescent quantum dot (ELQD) layers and a photoluminescent quantum dot (PLQD) layers.

In the following description of FIGS. 12-23 QD-LED display subpixel arrangements are described including a common ELQD-LED stack 701 that may include one or more of a HIL 720, HTL 730, QD layer 750, ETL 770, and EIL 780. It is to be appreciated that the illustrated ELQD-LED stack structure is exemplary, and embodiments are not so limited. For example, any of the QD-LED stack structures illustrated and described with regard to FIGS. 6-11B may be implemented in the display subpixel arrangements illustrated in FIGS. 12-23. Specifically, any of the previous embodiments described for matching the energy levels of the QD layer metal oxide coating and the adjacent HTL and/or ETL may be implemented, for example, to facilitate meeting of the electrons and holes and generation of an exciton in the emission layers of the QDs or facilitate increasing the recombination zone and increasing lifetime of the QD-LEDs. Furthermore, reference to QD layer 750B is generic for any combination of QD layers 752, 754, 756.

Likewise, the ELQD-LED stack 701 may include any of the HTL 740, ETL 760 in addition to, or in place of, HTL 730 and ETL 770.

The QD-LED displays illustrated and described with regard to FIGS. 12-23 each include a common ELQD-LED stack 701 spanning across both the ELQD subpixel 950B (e.g. blue) and the PLQD subpixels 950R, 950G (e.g. red and green). In one embodiment, a blue emitting ELQD-LED stack 701 generates a narrow-band blue light for the a blue ELQD subpixel 950B, and thin films of narrow-band red and green emitting PLQD layers 810R, 810G are optically excited by light generated by the ELQD-LED stack 701 to emit red and green light via photoluminescence to create the red and green PLQD subpixels 950R, 950G of a thin film display. While an RGB pixel arrangement is illustrated, this is exemplary, and embodiments are not limited to an RGB pixel arrangement. The display may be flexible and transparent, and total thicknesses of less than 1 mm may be achieved. Since light is generated by the QDs for all subpixels, the emission spectra may be tunable and narrow to enable an ultra-wide display color gamut (e.g. greater than 95% of Rec. 2020 color standard). Additionally, display contrast may be facilitated by each pixel being black in the off state.

In one aspect, fabrication of the QD-LED displays may be simplified since patterning is not necessary for the electroluminescent materials. For example, these common layers may be formed across the whole display substrate, spanning across all pixels. This may reduce fabrication costs due to few processing steps. Lifetime performance may be preserved with reduced contamination due to few processing steps and no exposure to patterning tools and chemicals for the electroluminescent materials. Embodiments are additionally compatible with high resolutions (e.g. greater than 440 pixels per inch) with large aperture ratios. With regard to the patterned photoluminescent films, these QD layers may be formed using a variety of processing techniques. For example, these QD layers may be coated (e.g. slot-die, inkjet) and selectively removed (e.g. photolithography, dry etching laser ablation) to the define the red and green subpixels. The photoluminescent QD layers may be deposited into preformed wells to the define the red and green subpixels. The photoluminescent QD layers may be formed as free standing pieces on a carrier substrate and transferred to the display substrate with a pick and place tool.

Each of the QD-LED display pixels illustrated in FIGS. 12-23 includes an electroluminescent quantum dot (ELQD) subpixel 950B (e.g. blue emitting) and photoluminescent quantum dot (PLQD) subpixels 950R, 950G (e.g. red and green emitting). A common ELQD-LED stack 701 spans across both the ELQD subpixel 950B and the PLQD subpixels 950R, 950G. In accordance with embodiments, the common ELQD-LED stack 701 includes a HTL 730, QD layer 750B, and ETL 770. Alternate and additional layers may be included in the ELQD-LED stack 701 such as a HIL 720, HTL 740, EIL 780, and optionally ETL 760. Photoluminescent quantum dot (PLQD) layers 810R, 810G are on the ELQD-LED stack 701 in the PLQD subpixels 950R, 950G, respectively, to down convert light emitted from the common ELQD-LED stack 701.

Referring now to FIG. 12 a schematic side view illustration is provided of a subpixel arrangement for a bottom emission QD-LED display in accordance with an embodiment. Display substrate 700 may be a variety of substrates, including a thin film transistor (TFT) substrate, and substrate with redistribution lines with controller chips bonded to the substrate, the controller chips including circuitry (e.g. drivers, etc.) for operating the pixels. In the embodiment illustrated, PLQD layers 810R, 810G are provided on the display substrate 700. For example, PLQD layers 810R, 810G could have been formed using a variety of techniques previously described including bulk substrate coating (e.g. slot-die, inkjet) followed by selective removal (e.g. photolithography, dry etching laser ablation), deposition into preformed wells on or in the display substrate 700, or individually transferred, for example with a pick and place tool. Separate anodes 710 are located over the individual PLQD layers 810R, 810G corresponding to PLQD supbixels 950R, 950G, and also over a portion of the display substrate 700 corresponding to ELQD subpixel 950B. A common ELQD-LED stack 701 is located over and spanning across all anodes 710 within the pixel, and a common cathode 790 layer is located over the common ELQD-LED stack 701. Various protective layers may then be formed over the common cathode 790 layer, such as passivation layer 910 (e.g. $SiN_x$), resin layer 920, and passivation layer 930 (e.g. $SiN_x$). As with a bottom emission structure, any of the passivation layers 910, 930 or resin layer 920 may optionally be opaque, transparent, or include a reflective layer.

FIG. 13 is a schematic side view illustration of a subpixel arrangement for a top emission QD-LED display in accordance with an embodiment. The structure of FIG. 13 is similar to that of FIG. 12, with one difference being location of the photoluminescent quantum dot (PLQD) layers 810R, 810G over the cathode 790 and ELQD-LED stack 701. In the embodiment illustrated in FIG. 13 a metal contact layer (e.g. Ag) may be formed on the display substrate 700 prior to forming the anodes 710. A common ELQD-LED stack 701 spans across both anodes 710 for both the ELQD subpixel 950B and the PLQD subpixels 950R, 950G, and a common cathode 790 layer is located over the common ELQD-LED stack 701. An optical enhancement layer 902 may be formed over the common cathode 790 layer, for example, to match refractive index between the common cathode 790 layer (e.g. Au, Ag, or Al) and the passivation layer 910 (e.g. $SiN_x$). Thus, the optical enhancement layer 902 may be characterized by a refractive index between that of its surrounding layers (e.g. common cathode 790 layer and the passivation layer 910). The optical enhancement layer 902 may also be referred to as a capping layer in microcavity design. In instances of a strong microcavity, the optical enhancement layer 902 (capping layer) may include a low or high refractive index. In instances of a weak microcavity, a capping layer may not be necessary, though refractive index matching, or out-coupling, may still be useful. In the embodiment illustrated, PLQD layers 810R, 810G are provided over the common cathode 790 layer, such as on the passivation layer 910. A cover layer 920 (e.g. including a resin material such as epoxy) may optionally be formed over the PLQD layers 810R, 810G, and a passivation layer 930 formed over the cover layer 920.

Figures 14, 15:
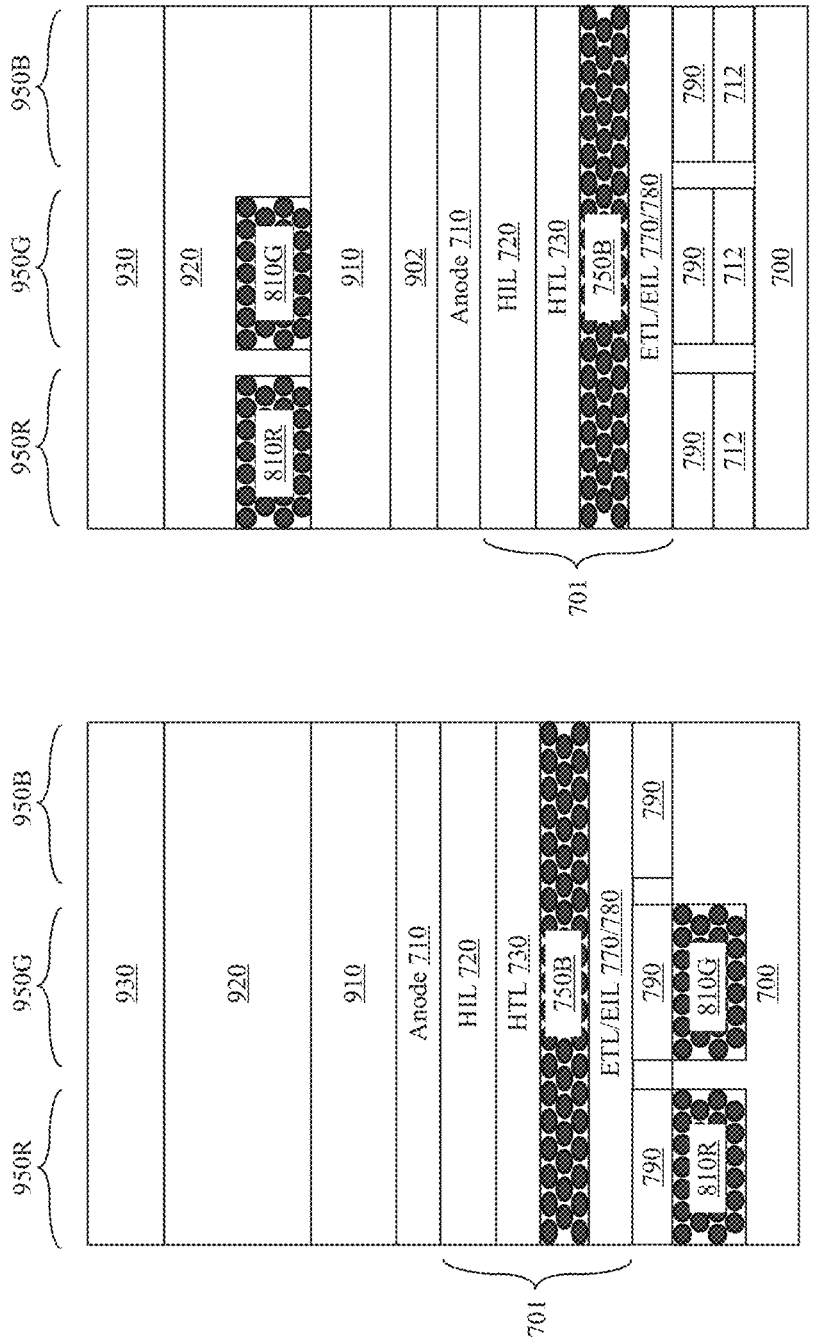
FIG. 14 is a schematic side view illustration of a subpixel arrangement for an inverted bottom emission QD-LED display in accordance with an embodiment.
FIG. 15 is a schematic side view illustration of a subpixel arrangement for an inverted top emission QD-LED display in accordance with an embodiment.

Referring now to FIGS. 14-15, schematic side view illustrations of subpixel arrangements are provided for an inverted bottom emission QD-LED display, and an inverted top emission QD-LED display in accordance with embodiments. The inverted bottom emission QD-LED display illustrated in FIG. 14 is similar to that illustrated and described with regard to FIG. 12, with the electrode (anode and cathode) layers being inverted, along with the ELQD-LED stack 701. The inverted top emission QD-LED display illustrated in FIG. 15 is similar to that illustrated and described with regard to FIG. 13, with the electrode (anode and cathode) layers being inverted, along with the ELQD-LED stack 701.

FIGS. 16-17 are schematic side view illustration of subpixel arrangements for tandem structure stack bottom emission QD-LED displays in accordance with embodiments. The tandem structure stacks illustrated in FIGS. 16-17 are similar to those illustrated and described with regard to FIG. 12 with the inclusion of multiple ELQD-LED stacks 701, with adjacent ELQD-LED stacks 701 separated from each other with a charge generation layer (CGL) 905 to provide positive (hole) current to the upper layers (e.g. HIL 720), and negative (electron) current to the lower layers (e.g. EIL 780). Typically a CGL 905 may be formed of two distinct layers. For example, the electron current can be provided by a layer formed of alkali metal salts such as LiF, low work function metals such as Ca, Ba, and n-doped material (e.g. combination of electron transport material and electron donating material). The hole current can be provided by a layer formed of a combination of arylamine based hole transport host and electron accepting dopant (e.g charge transfer salts), strongly electron accepting small organic molecules, metal oxides. In accordance with embodiments, CGLs 905 may be formed by thermal evaporation.

FIGS. 18-19 are schematic side view illustration of subpixel arrangements for tandem structure stack top emission QD-LED displays in accordance with embodiments. The tandem structure stacks illustrated in FIGS. 18-19 are similar to those illustrated and described with regard to FIG. 13 with the inclusion of multiple ELQD-LED stacks 701, with adjacent ELQD-LED stacks 701 separated from each other with a charge generation layer (CGL) 905 to provide positive (hole) current to the lower layers (e.g. HIL 720), and negative (electron) current to the upper layers (e.g. EIL 780).

FIGS. 20-21 are schematic side view illustration of subpixel arrangements for inverted tandem structure stack bottom emission QD-LED displays in accordance with embodiments. The tandem structure stacks illustrated in FIGS. 20-21 are similar to those illustrated and described with regard to FIG. 14 with the inclusion of multiple ELQD-LED stacks 701, with adjacent ELQD-LED stacks 701 separated from each other with a charge generation layer (CGL) 905 to provide positive (hole) current to the lower layers (e.g. HIL 720), and negative (electron) current to the upper layers (e.g. EIL 780).

FIGS. 22-23 are schematic side view illustration of subpixel arrangements for inverted tandem structure stack top emission QD-LED displays in accordance with embodiments. The tandem structure stacks illustrated in FIGS. 22-23 are similar to those illustrated and described with regard to FIG. 15 with the inclusion of multiple ELQD-LED stacks 701, with adjacent ELQD-LED stacks 701 separated from each other with a charge generation layer (CGL) 905 to provide positive (hole) current to the lower layers (e.g. HIL 720), and negative (electron) current to the upper layers (e.g. EIL 780).

In utilizing the various aspects of the embodiments, it would become apparent to one skilled in the art that combinations or variations of the above embodiments are possible for forming quantum dot layers and QD-LEDs. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A quantum dot LED display subpixel comprising:
a bottom electrode layer;
a hole transport layer over the bottom electrode layer;
a quantum dot layer over the hole transport layer, wherein the quantum dot layer includes a matrix of quantum dots including a core, a shell around the core, and a core-material coating around the shell, wherein the core-material coating consists of the core material;
wherein the matrix of quantum dots is a close packed film in which the shells of adjacent quantum dots are spaced apart by an average distance of 0.5 nm 10 nm, and the core-material coatings are in direct contact with one another;
an electron transport layer over the quantum dot layer; and
a top electrode layer over the electron transport layer.

2. The quantum dot LED display subpixel of claim 1, wherein: the core consists of a core material selected from the group consisting of: CdS, CdSe, CdTe, ZnS, ZnSe, ZnTe, GaAs, GaP, GaAs, GaSb, HgS, HgSe, HgTe, InAs, InP, InSb, AlAs, AlP, AlSb, InGaP, ZnSeTe, ZnCdS, ZnCdSe, and CdSeS; and the shell comprises a shell material different from the core material.

3. The quantum dot LED display subpixel of claim 1, further comprising a photoluminescent quantum dot layer over or under the quantum dot layer to down convert light emitted from the quantum dot layer.

4. The quantum dot LED display subpixel of claim 1, wherein the shells of adjacent quantum dots are spaced apart by an average distance of 0.5 nm-3.0 nm.

5. The quantum dot LED display subpixel of claim 4, wherein the core-material coatings have an average thickness of 0.25 nm-1.5 nm.

6. The quantum dot LED display subpixel of claim 1, wherein the electron transport layer comprises a first type of inorganic material.

7. The quantum dot LED display subpixel of claim 6, wherein the hole transport layer comprises a second type of inorganic material.

8. The quantum dot LED display subpixel of claim 6, wherein the quantum dot layer is directly on the hole transport layer, and the electron transport layer is directly on the quantum dot layer.

9. The quantum dot LED display subpixel of claim 1, wherein the electron transport layer comprises a first type of metal oxide particles.

10. The quantum dot LED display subpixel of claim 9, wherein the first type of metal oxide particles comprises ZnO particles.

11. The quantum dot LED display subpixel of claim 9, wherein the hole transport layer comprises a second type of metal oxide particles.

12. The quantum dot LED display subpixel of claim 11, wherein the quantum dot layer is directly on the hole transport layer, and the electron transport layer is directly on the quantum dot layer.

13. A quantum dot layer comprising:
a matrix of quantum dots;
wherein each quantum dot includes:
a core that consists of a core material selected from the group consisting of: CdS, CdSe, CdTe, ZnS, ZnSe, ZnTe, GaAs, GaP, GaAs, GaSb, HgS, HgSe, HgTe, InAs, InP, InSb, AlAs, AlP, AlSb, InGaP, ZnSeTe, ZnCdS, ZnCdSe, and CdSeS,
a shell around the core, wherein the shell comprises a shell material different from the core material; and
a core-material coating around the shell, wherein the core-material coating consists of the core material; and wherein the shells of adjacent quantum dots are spaced apart by an average distance of 0.5 nm-3.0 nm.

14. The quantum dot layer of claim 13, wherein the core-material coatings have an average thickness of 0.25 nm-1.5 nm.

15. The quantum dot layer of claim 13, further comprising a second matrix of quantum dots dispersed in the first matrix of quantum dots, wherein the quantum dots in the second matrix of quantum dots are smaller than the quantum dots in the matrix of quantum dots.

16. The quantum dot layer of claim 15, wherein the quantum dots in the second matrix of quantum dots include ligands bound to shells of the quantum dots in the second matrix of quantum dots.

* * * * *